(12) United States Patent
Nam et al.

(10) Patent No.: US 9,461,061 B2
(45) Date of Patent: Oct. 4, 2016

(54) VERTICAL MEMORY DEVICES AND METHODS OF MANUFACTURING THE SAME

(71) Applicants: Phil-Ouk Nam, Hwaseong-si (KR); Jun-Kyu Yang, Seoul (KR); Jin-Gyun Kim, Suwon-si (KR); Jae-Young Ahn, Seongnam-si (KR); Hun Hyeong Lim, Hwaseong-si (KR); Ki-Hyun Hwang, Seongnam-si (KR)

(72) Inventors: Phil-Ouk Nam, Hwaseong-si (KR); Jun-Kyu Yang, Seoul (KR); Jin-Gyun Kim, Suwon-si (KR); Jae-Young Ahn, Seongnam-si (KR); Hun Hyeong Lim, Hwaseong-si (KR); Ki-Hyun Hwang, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/546,172

(22) Filed: Nov. 18, 2014

(65) Prior Publication Data

US 2015/0137210 A1 May 21, 2015

(30) Foreign Application Priority Data

Nov. 19, 2013 (KR) ........................ 10-2013-0140281

(51) Int. Cl.
*H01L 27/115* (2006.01)
*H01L 29/66* (2006.01)
*H01L 29/792* (2006.01)

(52) U.S. Cl.
CPC ... *H01L 27/11582* (2013.01); *H01L 29/66833* (2013.01); *H01L 29/7926* (2013.01)

(58) Field of Classification Search
CPC ............... H01L 29/7926; H01L 29/66666; H01L 27/1052; H01L 29/7889; H01L 27/11556; H01L 21/8239; H01L 28/91; H01L 29/511; H01L 27/11582; H01L 21/30604
USPC .......................................... 438/699; 257/324
See application file for complete search history.

(56) References Cited

U.S. PATENT DOCUMENTS

| | | | |
|---|---|---|---|
| 8,026,546 B2 | 9/2011 | Murata et al. | |
| 8,344,385 B2 | 1/2013 | Kim et al. | |
| 2012/0147650 A1 | 6/2012 | Samachisa et al. | |
| 2012/0153291 A1 | 6/2012 | Kim et al. | |
| 2012/0241846 A1 | 9/2012 | Kawasaki et al. | |
| 2012/0299076 A1 | 11/2012 | Yoo et al. | |
| 2013/0065369 A1 | 3/2013 | Yang et al. | |
| 2014/0264549 A1* | 9/2014 | Lee ................... | H01L 27/11582 257/324 |
| 2015/0200112 A1* | 7/2015 | Han ................... | H01L 21/32133 438/478 |

FOREIGN PATENT DOCUMENTS

| | | |
|---|---|---|
| JP | 2012-094694 A | 5/2012 |
| KR | 10-2010-0078776 A | 7/2010 |
| KR | 10-2013-0015694 A | 2/2013 |

* cited by examiner

*Primary Examiner* — Caleen Sullivan
(74) *Attorney, Agent, or Firm* — Lee & Morse P.C.

(57) ABSTRACT

A method of manufacturing a vertical memory device includes forming alternating and repeating insulating interlayers and sacrificial layers on a substrate, the sacrificial layers including polysilicon or amorphous silicon, forming channel holes through the insulating interlayers and the sacrificial layers, forming channels in the channel holes, etching portions of the insulating interlayers and the sacrificial layers between adjacent channels to form openings, removing the sacrificial layers to form gaps between the insulating interlayers, and forming gate lines in the gaps.

17 Claims, 33 Drawing Sheets

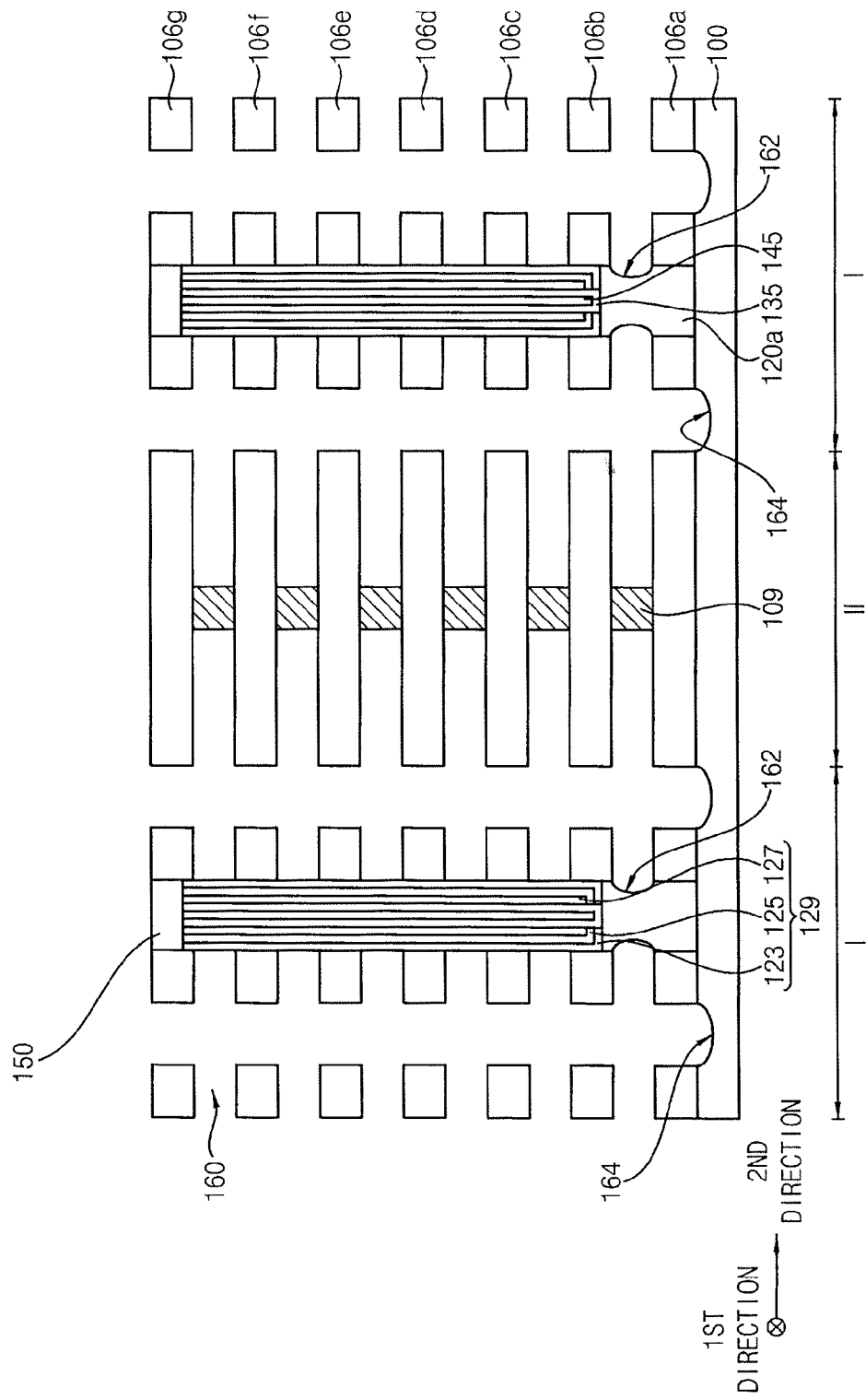

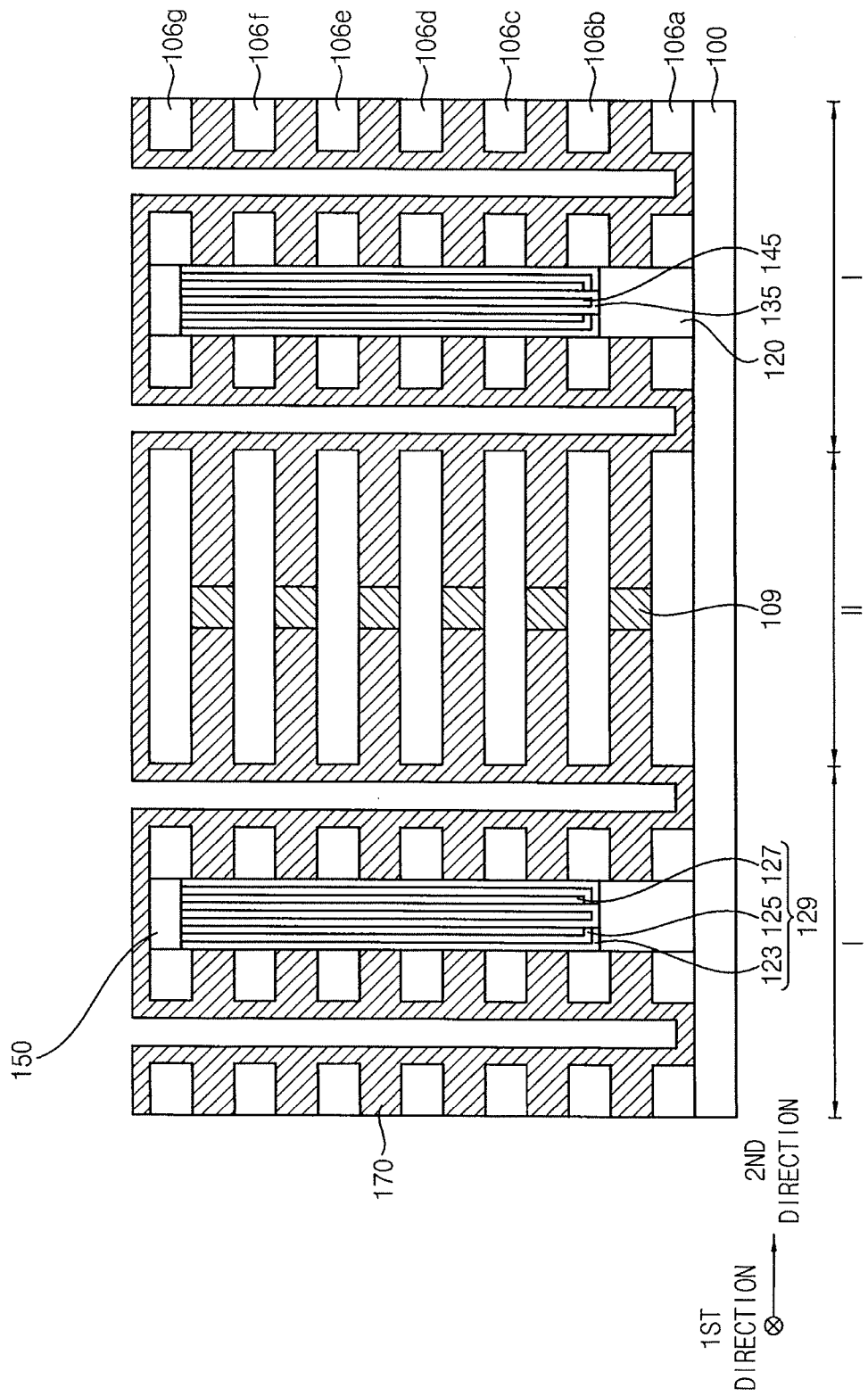

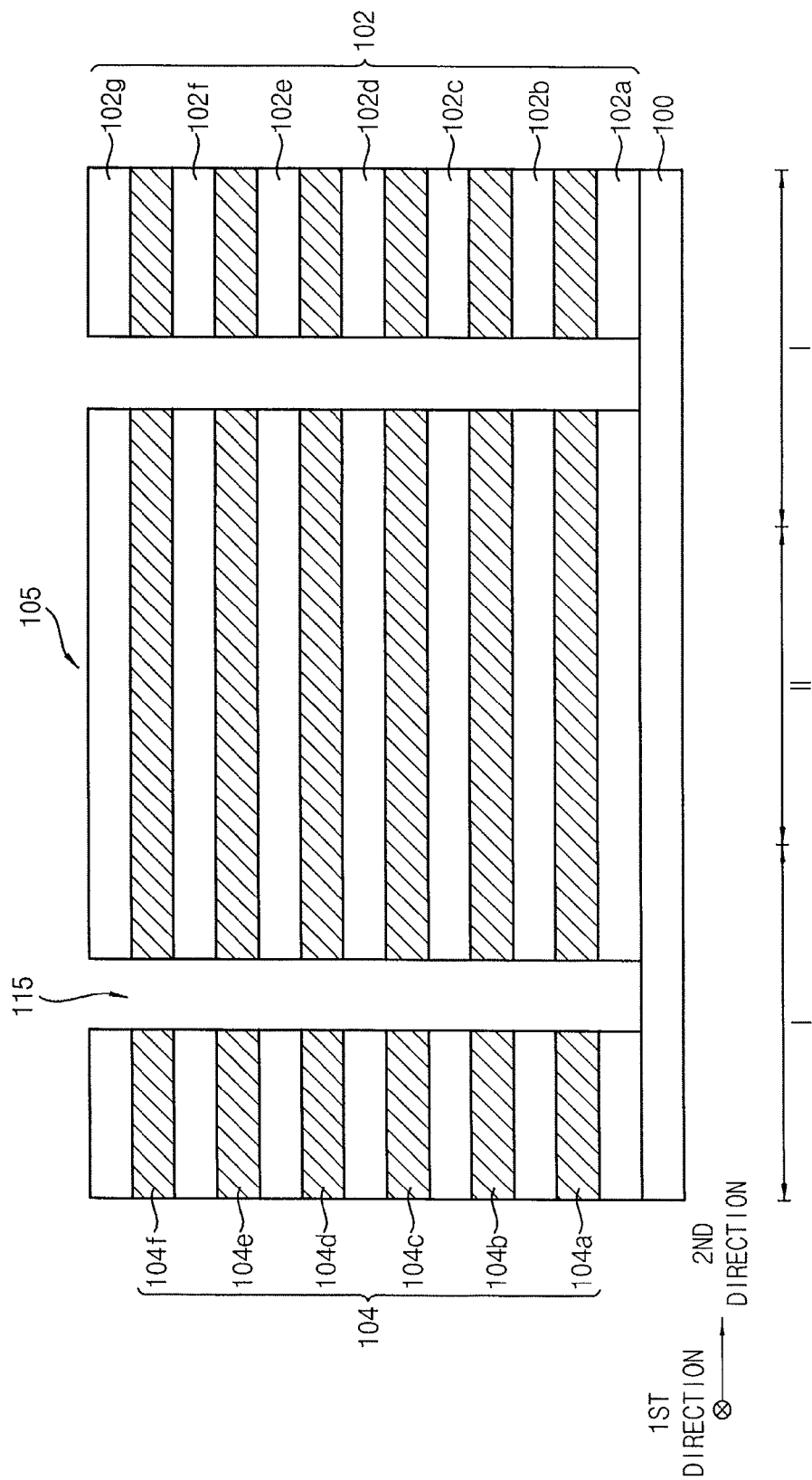

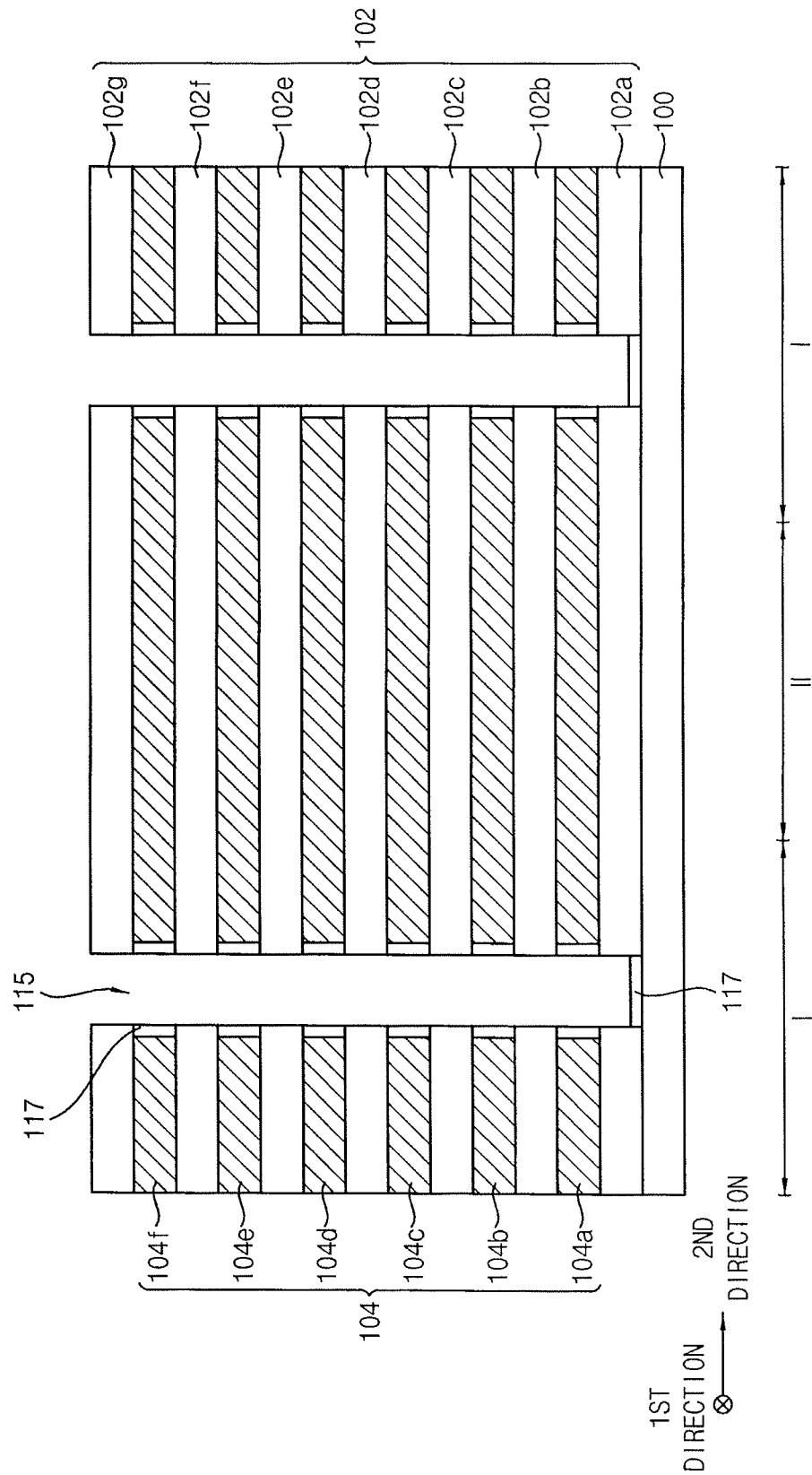

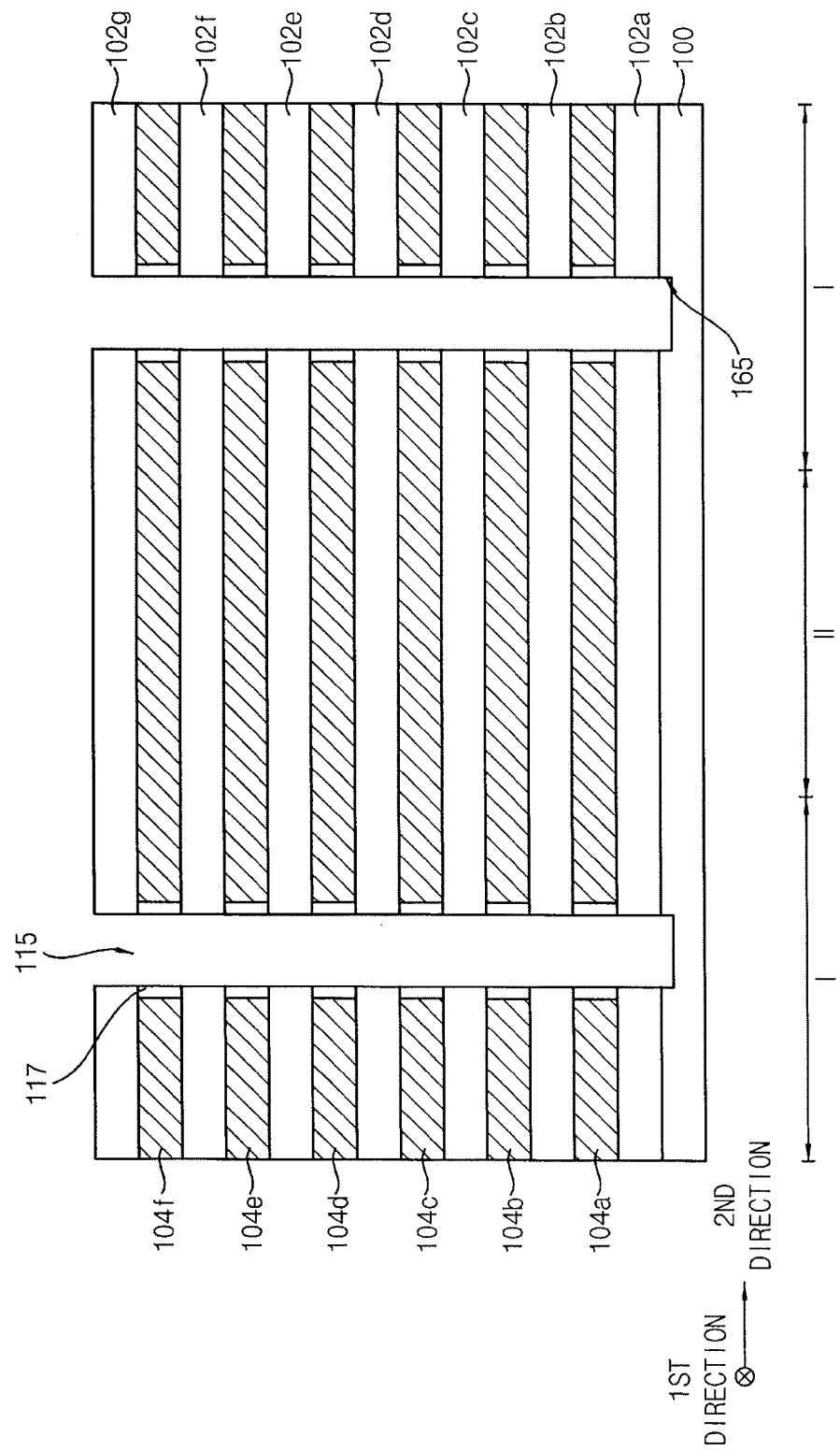

VERTICAL MEMORY DEVICES AND METHODS OF MANUFACTURING THE SAME

CROSS-REFERENCE TO RELATED APPLICATION

Korean Patent Application No. 10-2013-0140281, filed on Nov. 19, 2013, in the Korean Intellectual Property Office, and entitled: "Vertical Memory Devices And Methods Of Manufacturing The Same," is incorporated by reference herein in its entirety.

BACKGROUND

1. Field

Example embodiments relate to vertical memory devices and methods of manufacturing the same. More particularly, example embodiments relate to non-volatile memory devices including vertical channels and methods of manufacturing the same.

2. Description of the Related Art

Recently, a vertical memory device including memory cells stacked vertically with respect to a top surface of a substrate has been developed in order to realize a high degree of integration. In the vertical memory device, insulating interlayers and sacrificial layers are alternately and repeatedly stacked on the substrate to form a mold structure. Gate electrodes may be formed at spaces of the mold structure from which the sacrificial layers are removed.

SUMMARY

According to example embodiments, there is provided a method of manufacturing a vertical memory device. In the method, insulating interlayers and sacrificial layers are alternately and repeatedly on a substrate. The sacrificial layers include polysilicon or amorphous silicon. Channel holes are formed through the insulating interlayers and the sacrificial layers. Channels are formed in the channel holes. Portions of the insulating interlayers and the sacrificial layers between the adjacent channels are etched to form openings. The sacrificial layers are removed to form gaps between the insulating interlayers. Gate lines are formed in the gaps.

In example embodiments, the substrate may include a cell region on which the channel and the gate line are formed, and a dummy region between the adjacent cell regions.

In example embodiments, portions of the sacrificial layers may remain on the dummy region to form supporting patterns in the gaps of the dummy region.

In example embodiments, a dielectric layer structure may be further formed between a sidewall of the channel hole and the channel. The gate line may surround an outer sidewall of the dielectric layer structure.

In example embodiments, a semiconductor pattern may be further formed on a top surface of the substrate exposed by the channel hole before forming the channel. The channel may be formed on a top surface of the semiconductor pattern.

In example embodiments, the gate lines may include a ground selection line (GSL), a word line and a string selection line (SSL) sequentially stacked from the top surface of the substrate. The GSL may surround an outer sidewall of the semiconductor pattern.

In example embodiments, a lateral portion of the semiconductor pattern may be removed together with the sacrificial layers to form a first recess. The GSL may be inserted into the first recess.

In example embodiments, impurities may be provided through the opening to form an impurity region at an upper portion of the substrate. The impurity region may serve as a common source line (CSL).

In example embodiments, the upper portion of the substrate may be partially removed together with the sacrificial layers to form a second recess. The impurities may be implanted through the second recess.

In example embodiments, barrier oxide layer patterns may be further formed at lateral portions of the sacrificial layers exposed by the channel hole.

In example embodiments, portions of the sacrificial layers may remain in the gaps to form preliminary gate lines. In the formation of the gate lines, a metal layer which fills remaining portions of the gaps may be formed. The metal layer and the preliminary gate lines may be reacted to form a metal silicide pattern in each gap.

In example embodiments, the insulating interlayer may be formed using silicon oxide. The sacrificial layers may be removed by a gas phase etching process using a chlorine gas or a wet etching process using an etchant solution that contains a hydroxyl group.

According to example embodiments, there is provided a vertical memory device. The vertical memory device includes a substrate, insulating interlayer patterns, a channel, gate lines and supporting patterns. The substrate includes a cell region and a dummy region. The insulating interlayer patterns are stacked in a vertical direction with respect to a top surface of the substrate and spaced apart from each other. The channel extends in the vertical direction through the insulating interlayer patterns on the cell region. The gate lines are disposed between the insulating interlayer patterns neighboring in the vertical direction on the cell region. The gate line surrounds an outer sidewall of the channel. The supporting patterns are disposed between the insulating interlayer patterns neighboring in the vertical direction on the dummy region. The supporting pattern includes polysilicon or amorphous silicon.

In example embodiments, the vertical memory device may further include dummy gates disposed between the insulating interlayer patterns neighboring in the vertical direction on the dummy region and disposed at lateral portions of the supporting pattern.

In example embodiments, the vertical memory device may further include a semiconductor pattern disposed between the substrate and the channel. The semiconductor pattern may include a first recess formed at a lateral portion thereof. The gate lines may include a GSL, a word line and an SSL sequentially stacked from the top surface of the substrate. The GSL may be inserted into the first recess.

According to example embodiments, there is provided a method of manufacturing a vertical memory device. The method includes stacking a plurality of alternating insulating interlayers and sacrificial layers on a substrate along a vertical direction with respect to a top surface of a substrate, the insulating interlayers including an oxide-based material, and the sacrificial layers including polysilicon or amorphous silicon, forming channels through the plurality of insulating interlayers and sacrificial layers, the channels extending along the vertical direction, forming openings between adjacent channels, the openings extending along the vertical direction, removing the sacrificial layers through the openings, such that gaps are defined between insulating interlayers adjacent to each other along the vertical direction, and forming gate lines in the gaps.

Removing the sacrificial layers may include removing only the sacrificial layers among the sacrificial layers and the insulating interlayers, such that substantially no portions of the insulating interlayers are removed.

Removing the sacrificial layers may include leaving portions of the sacrificial layers in a dummy region.

Stacking the plurality of alternating insulating interlayers and sacrificial layers may include alternating silicon oxide insulating interlayers and polysilicon sacrificial layers, and removing the sacrificial layers may include etching using a chlorine gas or a solution containing a hydroxyl group.

BRIEF DESCRIPTION OF THE DRAWINGS

Example embodiments will be more clearly understood from the following detailed description taken in conjunction with the accompanying drawings. FIGS. 1A to 30 represent non-limiting, example embodiments as described herein.

FIGS. 1A and 1B illustrate cross-sectional views of vertical memory devices in accordance with example embodiments;

FIG. 2 illustrates a cross-sectional view of a vertical memory device in accordance with some example embodiments;

FIG. 3 illustrates a cross-sectional view of a vertical memory device in accordance with some example embodiments;

FIGS. 4-12, 13A, 13B, 14-16, 17A and 17B illustrate cross-sectional views of stages in a method of manufacturing a vertical memory device in accordance with example embodiments;

FIGS. 18 to 25 illustrate cross-sectional views of stages in a method of manufacturing a vertical memory device in accordance with some example embodiments; and FIGS. 26 to 30 illustrate cross-sectional views of stages in a method of manufacturing a vertical memory device in accordance with some example embodiments.

DETAILED DESCRIPTION

Figure 1A:
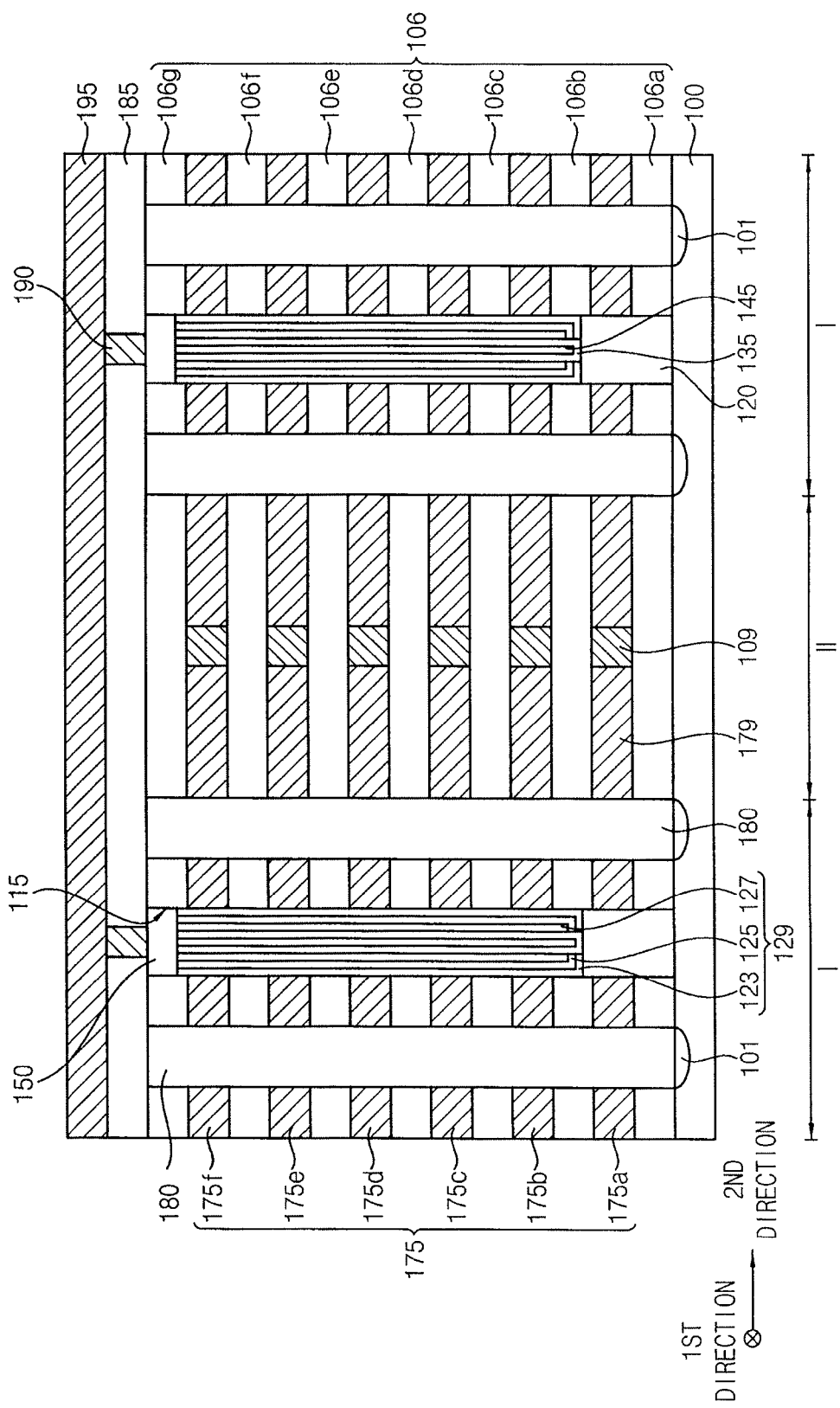

Various example embodiments will be described more fully hereinafter with reference to the accompanying drawings, in which some example embodiments are shown. Example embodiments may, however, be embodied in many different forms and should not be construed as limited to those set forth herein. Rather, these example embodiments are provided so that this description will be thorough and complete, and will fully convey the scope of the exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will also be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
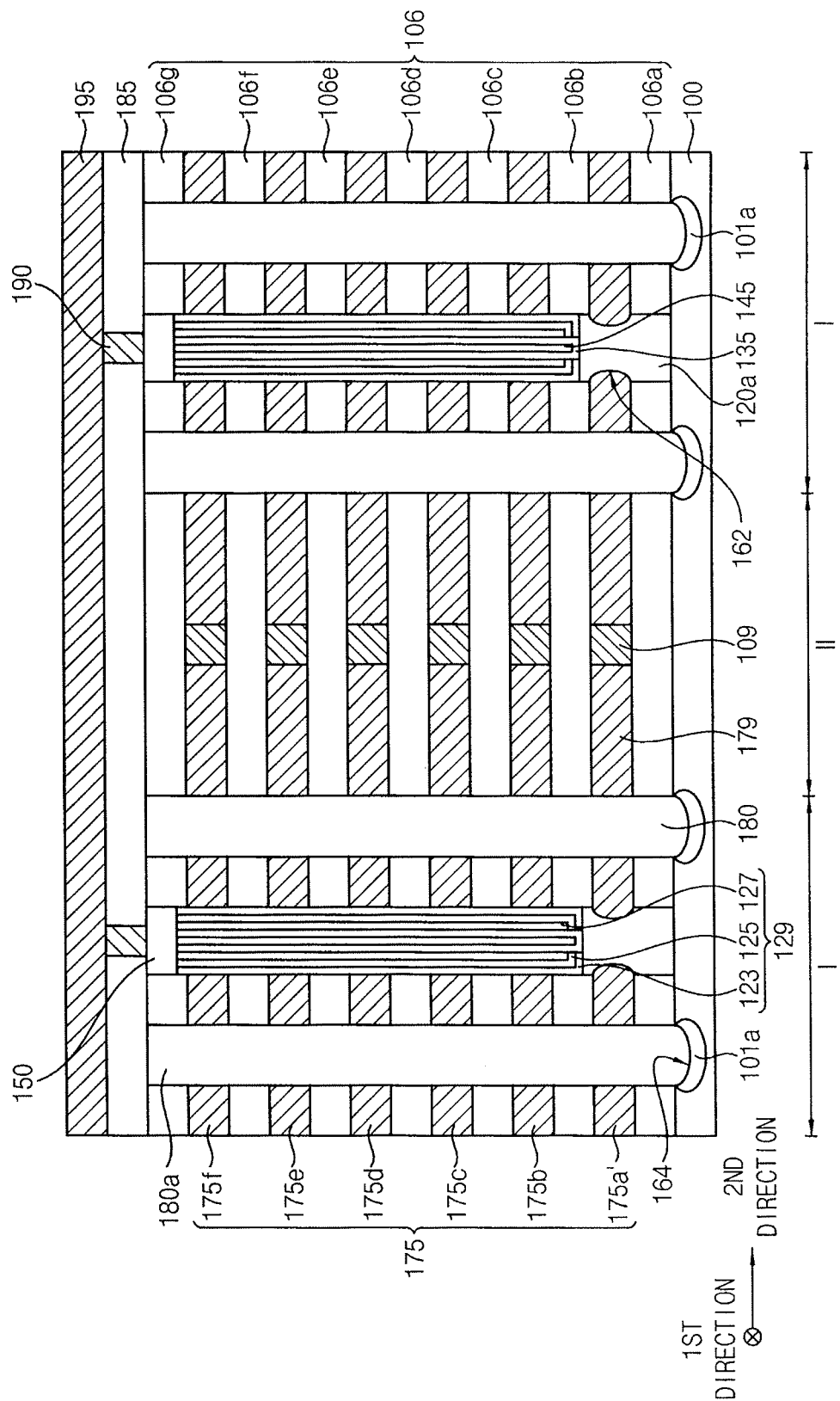

FIGS. 1A and 1B illustrate cross-sectional views of vertical memory devices in accordance with example embodiments.

Referring to FIG. 1A, a vertical memory device may include a semiconductor pattern 120 protruding upward from a top surface of a substrate 100 and filling a lower portion of a channel hole 115, a channel 135 disposed on the semiconductor pattern 120 and extending in a vertical direction with respect to the top surface of the substrate 100, a dielectric layer structure 129 surrounding an outer sidewall of the channel 135, and gate lines 175 formed on an outer sidewall of the dielectric layer structure 129 and spaced apart from each other in the vertical direction. A pad 150 may be disposed on the channel 135 and the dielectric layer structure 129 to cap the channel hole 115. The vertical memory device may further include a bit line contact 190 in contact with the pad 150 and a bit line 195 electrically connected to the bit line contact 190.

The substrate 100 may include a semiconductor material, e.g., single crystalline silicon or germanium. In example embodiments, the substrate 100 may include a cell region I and a dummy region II. Memory cells may be stacked in the cell region I, and the dummy region II may be defined between adjacent cell regions I.

The semiconductor pattern 120 may be formed on the cell region I of the substrate 100 and may fill the lower portion of the channel hole 115 through which the top surface of the substrate 100 may be exposed. In example embodiments, the semiconductor pattern 120 may include polysilicon or single crystalline silicon. In one example embodiment, the semiconductor pattern 120 may further include, e.g., n-type impurities such as phosphorous (P) or arsenic (As).

The channel 135 may be formed on the semiconductor pattern 120 and have a hollow cylindrical shape or a cup shape. The channel 135 may include polysilicon or single crystalline silicon. The channel 135 may further include, e.g., p-type impurities such as boron (B).

A plurality of the channels 135 may be arranged in a first direction substantially parallel to the top surface of the substrate 100 to form a channel row. A plurality of the channel rows may be arranged on the cell region I. For example, at least two channel rows may be arranged on each cell region I in a second direction substantially parallel to the top surface of the substrate 100 and perpendicular to the first direction. It is further noted that the vertical direction extends along a normal to a plane defined by the first and second directions.

A first filling layer pattern 145 may be formed in the channel 135. The first filling layer pattern 145 may have a pillar shape or a solid cylindrical shape. The first filling layer pattern 145 may include an insulation material, e.g., silicon oxide.

In one example embodiment, the channel 135 may have a pillar shape or a solid cylindrical shape. In this case, the first filling layer pattern 145 may be omitted.

The dielectric layer structure 129 may be formed on a peripheral portion of a top surface of the semiconductor pattern 120 and on a sidewall of the channel hole 115. The dielectric layer structure 129 may be in contact with the outer sidewall of the channel 135. The dielectric layer structure 129 may have a cup shape of which a central bottom is opened, or a straw shape.

The dielectric layer structure 129 may include a tunnel insulation layer pattern 127, a charge storage layer pattern 125, and a first blocking layer pattern 123 sequentially formed from the outer sidewall of the channel 135. The first blocking layer pattern 123 may include an oxide, e.g., silicon oxide, or a metal oxide, e.g., a hafnium oxide or aluminum oxide. The charge storage layer pattern 125 may include a nitride, e.g., silicon nitride, or a metal oxide, and the tunnel insulation layer pattern 127 may include an oxide, e.g., silicon oxide. In one example embodiment, the dielectric layer structure 129 may have an oxide-nitride-oxide (ONO) layer structure.

The pad 150 may be disposed on the first filling layer pattern 145, the channel 135, and the dielectric layer structure 129 to fill an upper portion of the channel hole 115. The pad 150 may be electrically connected to the bit line 195 via the bit line contact 190. The pad 150 may serve as a source/drain region through which charges are moved or transferred to the channel 135. The pad 150 may include polysilicon or single crystalline silicon. The pad 150 may further include, e.g., n-type impurities such as phosphorus or arsenic.

The gate lines 175 may be formed on the outer sidewall of the dielectric layer structure 129 and stacked in the vertical direction. In example embodiments, each gate line 175 may partially surround the channels 135 included in the at least one channel row to extend in the first direction.

The gate line 175 may include a metal or a metal nitride. For example, the gate line 175 may include a metal or a metal nitride having a low electrical resistance, e.g., tungsten (W), tungsten nitride, titanium (Ti), titanium nitride, tantalum (Ta), tantalum nitride, platinum (Pt), etc. In one example embodiment, the gate line 175 may have a multi-layered structure including a barrier layer formed of the metal nitride, and a metal layer.

A lowermost gate line 175*a* may serve as a ground selection line (GSL), four gate lines 175*b*, 175*c*, 175*d*, and 175*e* on the GSL may serve as word lines, and an uppermost gate line 175*f* on the word lines may serve as a string selection line (SSL). The GSL 175*a* may surround a lateral portion of the semiconductor pattern 120, and the semiconductor pattern 120 may serve as a channel of the GSL 175*a*.

As described above, the GSL, the word lines, and the SSL may be formed at a single level, four levels, and a single level, respectively. For example, as illustrated in FIG. 1A, the GSL, i.e., the lowermost gate line 175*a*, may be formed in a single level, the four word lines, i.e., gates lines 175*b* through 175*e*, may be stacked in four layers on the GSL, and the SSL, i.e., the uppermost gate line 175*f*, may be formed in a single layer on the gate line 175*e*. However, the numbers of the levels at which the GSL, the word line, and the SSL are formed are not limited to the above, e.g., both of the GSL and the SSL may be formed at 2 levels, and the word lines may be formed as 2, 8 or 16 levels. The stacked number of the gate lines 175 may be determined in consideration of, e.g., an integration degree and a circuit design of the vertical memory device.

Insulating interlayer patterns 106 may be disposed in the first direction to be positioned between neighboring gate lines 175 in the vertical direction. For example, as illustrated in FIG. 1A, the insulating interlayer patterns 106 may include insulating interlayer patterns 106*a*, 106*b*, 106*c*, 106*d*, 106*e*, 106*f*, and 106*g*. The insulating interlayer patterns 106 may include a silicon oxide based material, e.g., silicon dioxide ($SiO_2$), silicon oxycarbide (SiOC) or fluorinated silicon oxide (SiOF). The gate lines 175 included in a cell string may be insulated from each other by the insulating interlayer patterns 106.

In one example embodiment, a second blocking layer pattern (not illustrated) may be further formed between the gate lines 175 and the dielectric layer structure 129, and between the gate lines 175 and the semiconductor pattern 129.

An impurity region 101 may be formed at an upper portion of the substrate 100 between adjacent channel rows or between adjacent cell strings. The impurity region 101 may extend in the first direction and serve as a common source line (CSL) of the vertical memory device. The impurity region 101 may include n-type impurities, e.g., phosphorous or arsenic. In one example embodiment, a metal silicide pattern, e.g., a cobalt silicide pattern or a nickel silicide pattern, may be further formed on the impurity region 101.

A second filling layer pattern 180 may be disposed on the impurity region 101 to fill a space between adjacent cell strings. The second filling layer pattern 180 may include an insulation material, e.g., silicon oxide. The adjacent cell strings may be insulated from each other by the second filling layer pattern 180.

An upper insulation layer 185 may be formed on an uppermost insulating interlayer pattern, on the insulating interlayer patterns 106g, the pad 150, and the second filling layer pattern 180. The bit line contact 190 may be formed through the upper insulation layer 185 to contact the pad 150. The bit line 195 may be disposed on the upper insulation layer 185 to be electrically connected to the bit line contact 190. In example embodiments, a plurality of the bit line contacts 190 may form an array comparable to an arrangement of the pads 150 or the channels 135. The bit line 195 may extend in the second direction to be electrically connected to a plurality of the pads 150 via the bit line contacts 190. A plurality of the bit lines 195 may be arranged in the first direction.

The upper insulating layer 185 may include an insulation material, e.g., silicon oxide. The bit line contact 190 and the bit line 195 may include a conductive material, e.g., a metal, a metal nitride, or doped polysilicon.

In one example embodiment, the second filling layer pattern 180 and the upper insulation layer 185 may be merged or may be integral with each other.

In example embodiments, the insulating interlayer patterns 106 may be disposed on the dummy region II of the substrate 100 to be spaced apart from each other in the vertical direction. A supporting pattern 109 and a dummy gate 179 may be disposed at each level between the insulating interlayer patterns 106 on the dummy region II. For example, as illustrated in FIG. 1, one supporting pattern 109 between two adjacent dummy gates 179 in the second direction may define a single horizontal layer, such that the single horizontal layer separates two adjacent insulating interlayer patterns 106 in the vertical direction.

In example embodiments, the supporting pattern 109 may include polysilicon or amorphous silicon. The supporting pattern 109 may further include impurities doped therein. The insulating interlayer patterns 106 may be supported by the supporting pattern 109 on the dummy region II.

The dummy gates 179 may be formed on both sidewalls of the supporting pattern 109 at each level, e.g., in each horizontal layer. In example embodiments, the dummy gate 179 may include a substantially same or similar material to that of the gate lines 175, and may be formed simultaneously with the gate lines 175.

According to another embodiment, referring to FIG. 1B, a first recess 162 may be formed at a lateral portion of a semiconductor pattern 120a. In this case, the semiconductor pattern 120a may include undoped polysilicon or undoped single crystalline silicon. A GSL 175a' may be inserted or buried in the first recess 162. Thus, the GSL 175a' may have a buried gate structure so that a channel area formed between the semiconductor pattern 120a and the GSL 175a' may be expanded. Accordingly, operational characteristics of a transistor including the GSL 175a' may be enhanced.

In one example embodiment, a second recess 164 may be formed at an upper portion of the substrate 100 in contact with a second filling layer pattern 180a. In this case, an impurity region 101a may have an area or a volume greater than that of the impurity region 101 illustrated in FIG. 1A. Thus, an electrical resistance of the CSL may be reduced. An expanded distance of the impurity region 101a may be adjusted to prevent a short-channel phenomenon between the impurity region 101a and the semiconductor pattern 120a.

Figure 2:
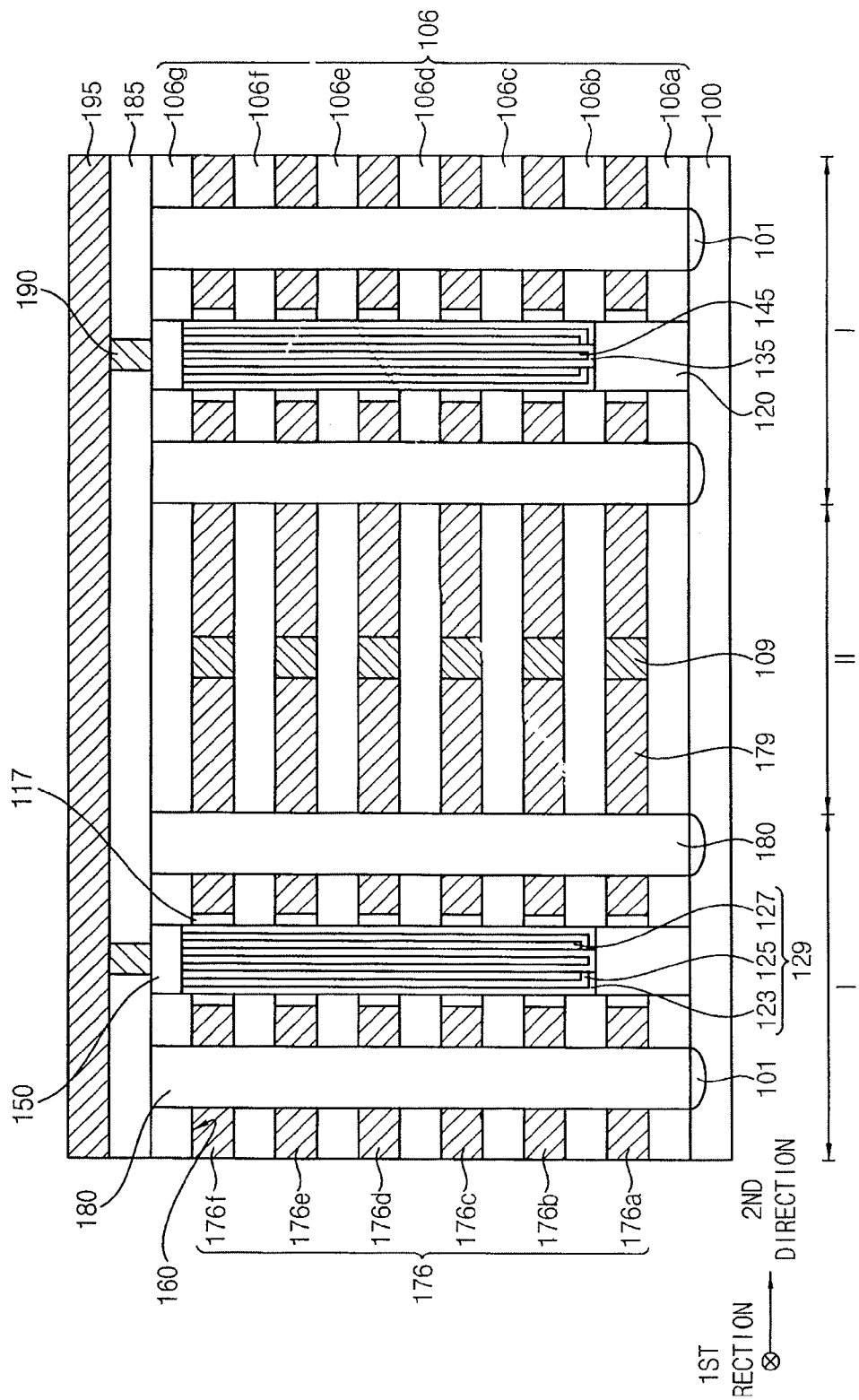

FIG. 2 illustrates a cross-sectional view of a vertical memory device in accordance with some example embodiments. The vertical memory device of FIG. 2 includes elements and/or constructions substantially the same as or similar to those described previously with reference to FIG. 1A, except for an addition of a barrier oxide layer pattern. Thus, detailed descriptions of repeated elements and structures are omitted, and like reference numerals are used to indicate like elements.

Referring to FIG. 2, gate lines 176 and barrier oxide layer patterns 117 may be disposed between insulating interlayer patterns 106 on a cell region I, e.g., the gate lines 176 and the insulating interlayer patterns 106 may be arranged alternately on the substrate 100 along the vertical direction. In detail, a gap 160 may be defined at each level, e.g., layer, between the insulating interlayer patterns 106 on the cell region I, e.g., the gap 160 may be defined between every two insulating interlayer patterns 106 adjacent to each other along the vertical direction. Next, the barrier oxide layer pattern 117 may be formed in each gap 160 to be in contact with a sidewall of a dielectric layer structure 129. Next, the gate line 176 may be formed on a sidewall of the barrier oxide layer pattern 117 to fill a remaining portion of the gap 160, e.g., so the gate lines 176 and barrier oxide layer patterns 117 may fill the gaps 160 between adjacent insulating interlayer patterns 106. In example embodiments, the barrier oxide layer pattern 117 may include, e.g., silicon oxide.

The gate lines 176 may include, e.g., a GSL 176a, word lines 176b, 176c, 176d, and 176e, and an SSL 176f, sequentially stacked from a top surface of the substrate 100. One barrier oxide layer pattern 117 at a lowermost level may be disposed between the GSL 176a and the semiconductor pattern 120. The remaining barrier oxide layer patterns 117 may be disposed between respective gate lines 176 and the channel 135, together with the dielectric layer structure 129, to serve as a second blocking layer pattern. The barrier oxide layer pattern 117 disposed between the GSL 176a and the semiconductor layer pattern 120 may solely serve as a gate insulation layer.

In one example embodiment, the barrier oxide pattern 117 may be also formed between the insulating interlayer pattern 106 and the dielectric layer structure 129, or between the semiconductor pattern 120 and the insulating interlayer pattern 106. In this case, the barrier oxide layer pattern 117 may be merged or integral with the insulating interlayer pattern 106.

Figure 3:
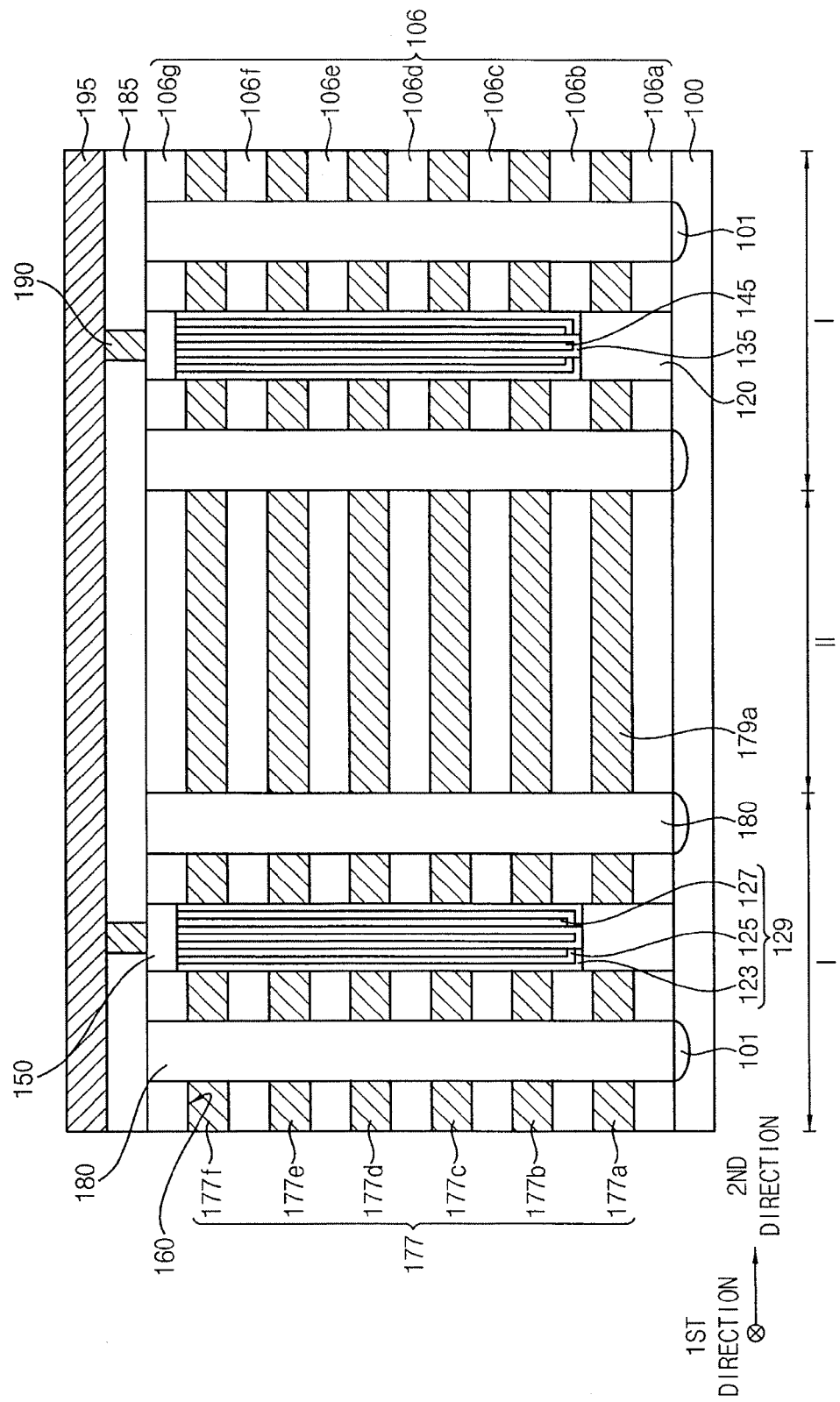

FIG. 3 illustrates a cross-sectional view of a vertical memory device in accordance with some example embodiments. The vertical memory device of FIG. 3 may include elements and/or constructions substantially the same as or similar to those described previously with reference to FIG. 1A, except for a gate line and a dummy gate. Thus, detailed descriptions of repeated elements and structures are omitted, and like reference numerals are used to indicate like elements.

Referring to FIG. 3, a gate line 177 may include a metal silicide. For example, the gate line 177 may include a nickel silicide or a cobalt silicide. For example, as illustrated in FIG. 3, the gate line 177 may include a plurality of gate lines 177a, 177b, 177c, 177d, 177e, 177f.

In example embodiments, a polysilicon pattern may remain in the gap 160 between insulating interlayer patterns 106. The polysilicon pattern may be reacted with a metal layer, e.g., including cobalt or nickel, to form the gate line 177.

A dummy gate 179a may be disposed at each level between the insulation interlayer patterns 106 on the dummy region II. In example embodiments, the dummy gate 179a may include a material or a composition substantially the same as or similar to that of the gate line 177, and may be formed simultaneously with the gate line 177. In one example embodiment, a supporting pattern formed on the dummy region II illustrated in FIGS. 1A, 1B and 2 may be merged with or integral with the dummy gate 179a.

FIGS. 4-12, 13A, 13B, 14-16, 17A and 17B illustrate cross-sectional views of stages in a method of manufacturing a vertical memory device in accordance with example embodiments. For example, FIGS. 4-12, 13A, 14-16, and 17A are cross-sectional views of stages in a method of manufacturing the vertical memory device of FIG. 1A, and FIGS. 4-12, 13B, 14-16, and 17B are cross-sectional views of stages in a method of manufacturing the vertical memory device of FIG. 1B.

Figure 4:
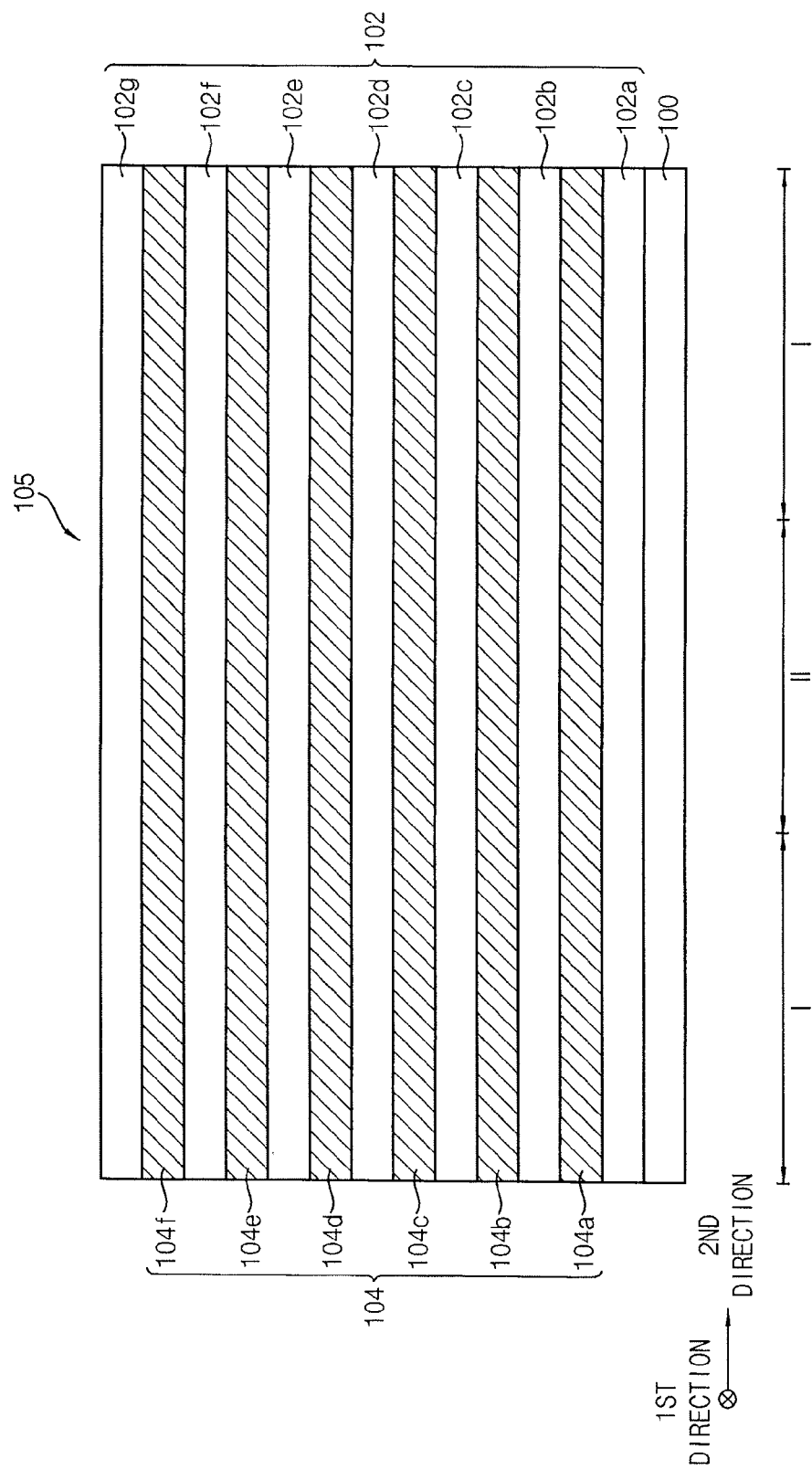

Referring to FIG. 4, a plurality of insulating interlayers 102 and sacrificial layers 104 may be formed alternately and repeatedly on the substrate 100 to form, e.g., define, a mold structure 105. For example, as illustrated in FIG. 4, a plurality of insulating interlayers 102a, 102b, 102c, 102d, 102e, 102f, and 102g may be arranged to alternate with a plurality of sacrificial layers 104a, 104b, 104c, 104d, 104e, and 104.

The substrate 100 may include a semiconductor material, e.g., single crystalline silicon and/or germanium. The substrate 100 may include the cell region I and the dummy region II. In example embodiments, the channel 135 (see FIG. 10) and gate lines 175 (see FIG. 15) may be formed on the cell region I of the substrate 100 by subsequent processes. The dummy region II may be defined between cell regions I neighboring each other in the second direction.

In example embodiments, the insulating interlayer 102 may be formed using an oxide-based material. For example, the insulating interlayer 102 may be formed using a silicon oxide based material, e.g., silicon dioxide, silicon oxycarbide, or fluorinated silicon oxide. The sacrificial layer 104 may be formed using a material that may have a high etching selectivity with respect to the insulating interlayer 102. For example, the sacrificial layer 104 may be formed using polysilicon or amorphous silicon. In one example embodiment, the sacrificial layer 104 may be formed using polysilicon or amorphous silicon doped with p-type impurities, n-type impurities, or carbon.

The insulating interlayer 102 and the sacrificial layer 104 may be formed by, e.g., a chemical vapor deposition (CVD) process, a plasma enhanced chemical vapor deposition (PECVD) process, an atomic layer deposition (ALD) process, etc. A lowermost insulating interlayer 102, e.g., insulating interlayer 102a, may be formed by performing a thermal oxidation process on the substrate 100.

The sacrificial layers 104 may be removed in a subsequent process to provide spaces for a GSL, a word line, and an SSL. Thus, the number of the insulating interlayers 102 and the sacrificial layers 104 may be adjusted in consideration of the number of the GSL, the word line, and the SSL. In example embodiments, each of the GSL and the SSL may be formed at a single level, e.g., as a single layer, and the word line may be formed in multiple levels, e.g., four layers. Accordingly, the sacrificial layers 104 may be formed in six levels, e.g., a total number of sacrificial layers 104 may be six, and the insulating interlayers 102 may be formed in seven levels, e.g., a total number of insulating interlayers 102 may be seven. In one example embodiment, each of the GSL and the SSL may be formed as two levels, e.g., each of the GSL and the SSL may be a single layer, and the word line may be formed as 2, 8 or 16 levels, e.g., layers. In this case, the sacrificial layers 104 may be formed at 6, 12 or 20 levels, and the insulating interlayers 102 may be formed at 7, 13 or 21 levels. However, the number of the GSL, the SSL, and the word lines is not limited herein.

Figure 5:
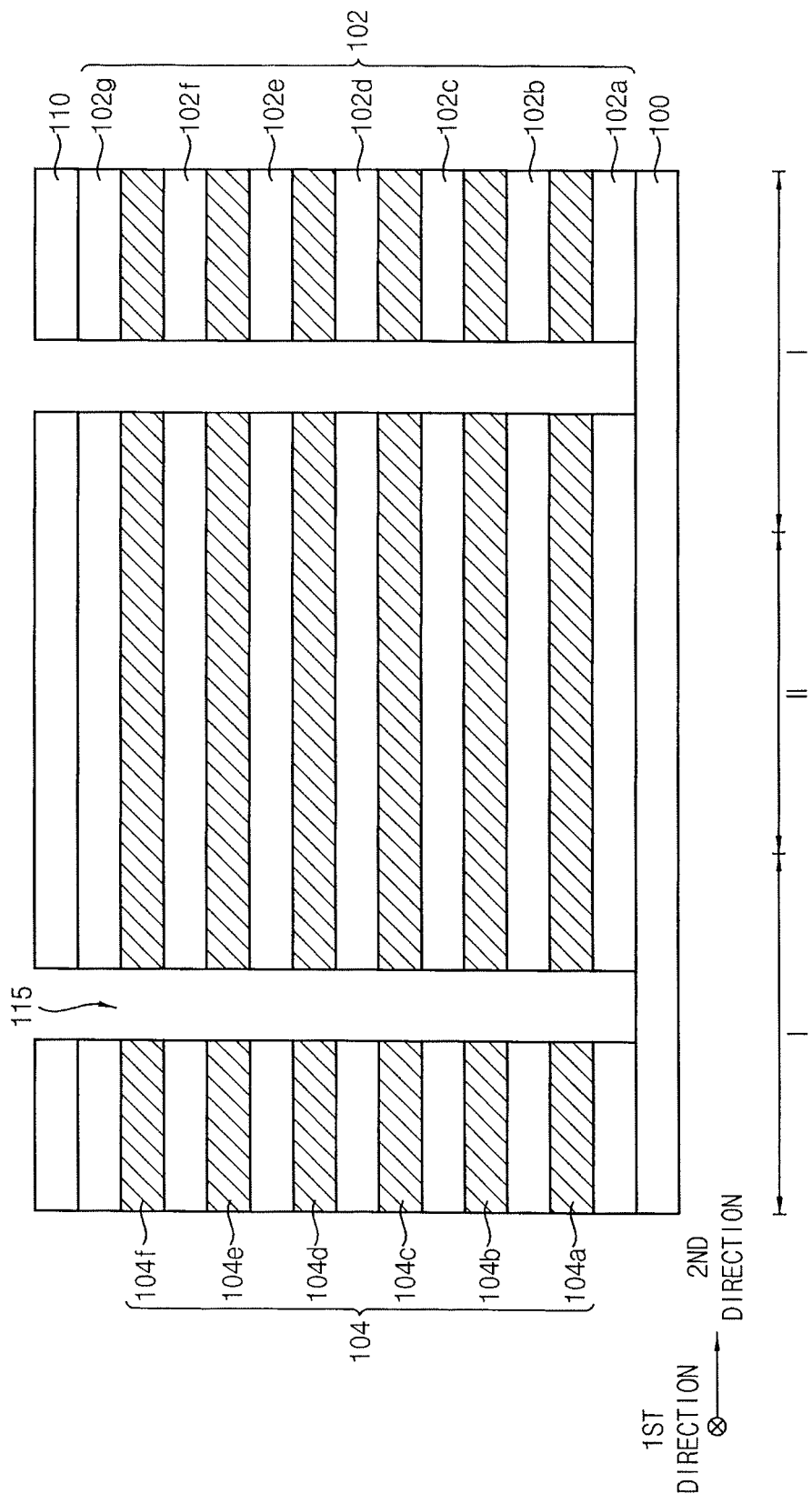

Referring to FIG. 5, a channel hole 115 may be formed through the mold structure 105.

In example embodiments, a hard mask 110 may be formed on an uppermost insulating interlayer 102, e.g., on the insulating interlayer 102g. Portions of the insulating interlayers 102 and the sacrificial layers 104 formed on the cell region I may be etched using the hard mask 110 as an etching mask to form the channel hole 115. A top surface of the substrate 100 may be exposed by the channel hole 115, and the channel hole 115 may extend in the vertical direction with respect to the top surface of the substrate 100. The hard mask 110 may be formed using, e.g., a silicon-based or a carbon based spin-on hard mask (SOH) material.

In example embodiments, a plurality of the channel holes 115 may be formed in the first direction parallel to the top surface of the substrate 100 to define a channel hole row. A plurality of the channel hole rows may be formed in the second direction parallel to the top surface of the substrate 100 and perpendicular to the first direction on each cell region I.

Figure 6:
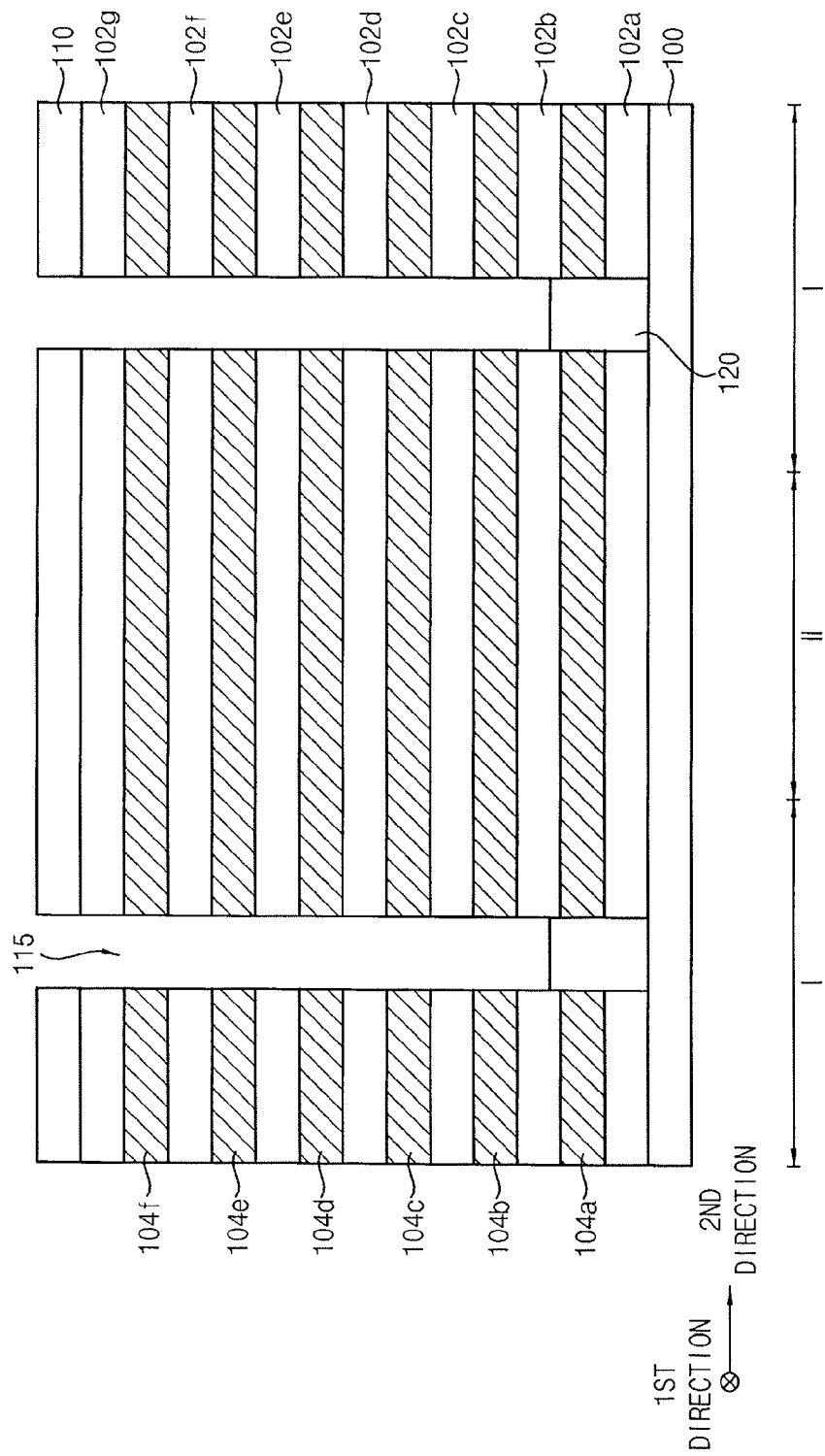

Referring to FIG. 6, the semiconductor pattern 120 partially filling the channel hole 115 may be formed on the substrate 100.

In example embodiments, the semiconductor pattern 120 may be formed by a selective epitaxial growth (SEG) process using the top surface of the substrate 100 as a seed. Accordingly, the semiconductor pattern 120 may include a material substantially the same as or similar to that of a material of the substrate 100. For example, the semiconductor pattern 120 may include single crystalline silicon or germanium. In another example, an amorphous silicon layer filling the channel hole 115 may be formed, and then a laser epitaxial growth (LEG) process or a solid phase epitaxy (SPE) process may be performed on the amorphous silicon layer to obtain the semiconductor pattern 120. In one example embodiment, n-type impurities, e.g., phosphorous or arsenic, may be implanted into the semiconductor pattern 120.

In example embodiments, a top surface of the semiconductor pattern 120 may be higher than a top surface of a first sacrificial layer 104 at a lowermost level, e.g., the sacrificial layer 104a, relative to the substrate 100. Further, the top surface of the semiconductor pattern 120 may be lower than a bottom surface of a second sacrificial layer 104 on the first sacrificial layer 104a, e.g., sacrificial layer 104b, relative to the substrate 100. For example, the top surface of the semiconductor pattern 120 may overlap an insulating interlayer 102 between the first and second sacrificial layers 104a and 104b. Accordingly, the semiconductor pattern 120 may be provided as a channel for the GSL 175a (see FIG. 15) substituting the first sacrificial layer 104a.

Figure 7:
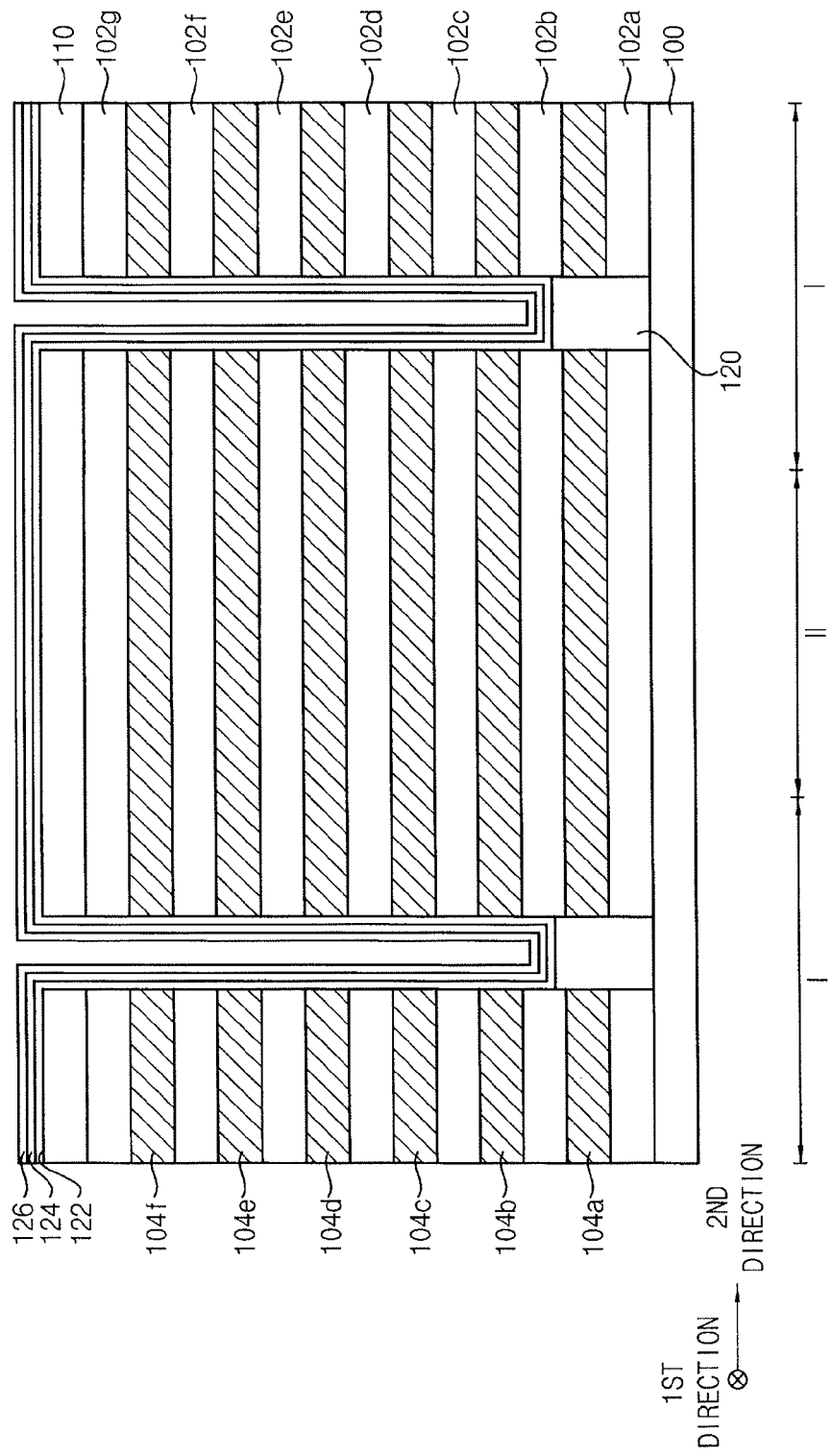

Referring to FIG. 7, a first blocking layer 122, a charge storage layer 124, and a tunnel insulation layer 126 may be sequentially, e.g., and conformally, formed on the hard mask 110, sidewalls of the channel holes 115, and the top surfaces of the semiconductor patterns 120.

In example embodiments, the first blocking layer 122 may be formed using silicon oxide or a metal oxide, e.g., hafnium oxide or aluminum oxide. The charge storage layer 124 may be formed using a nitride, e.g., silicon nitride, or a metal oxide. The tunnel insulating layer 126 may be formed using an oxide, e.g., silicon oxide. For example, the first blocking layer 122, the charge storage layer 124, and the tunnel insulation layer 126 may be stacked as an ONO layer structure. The first blocking layer 122, the charge storage layer 124, and the tunnel insulation layer 126 may be formed by, e.g., a CVD process, a PECVD process, an ALD process, etc.

Figure 8:
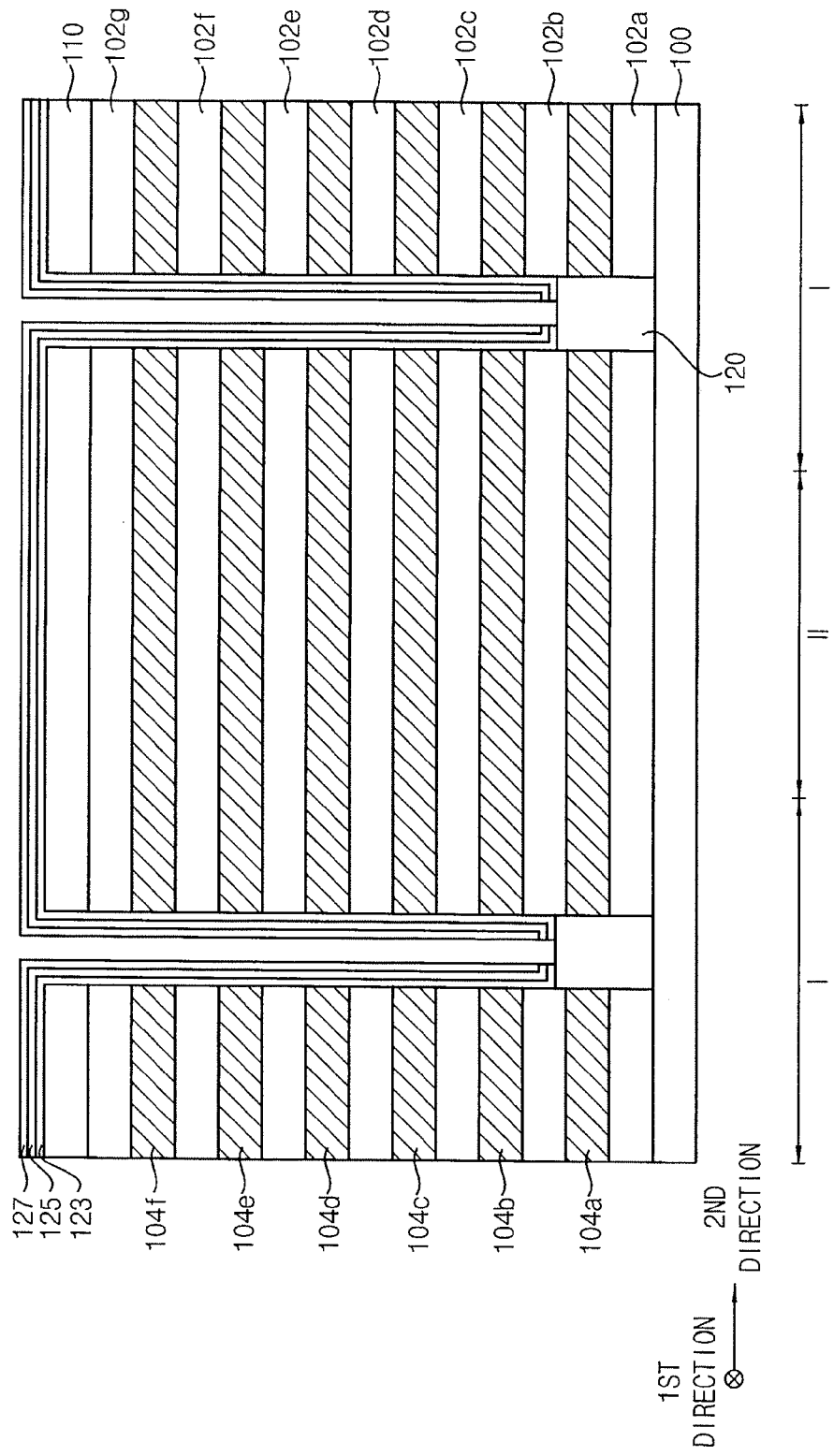

Referring to FIG. 8, the first blocking layer 122, the charge storage layer 124, and the tunnel insulation layer 126 may be anisotropically etched to partially expose the top surface of the semiconductor pattern 120. Accordingly, a first blocking layer pattern 123, a charge storage layer pattern 125, and a tunnel insulation layer pattern 127 may be formed sequentially on the hard mask 110, the sidewall of the channel hole 115, and the top surface of the semiconductor pattern 120.

Figure 9:
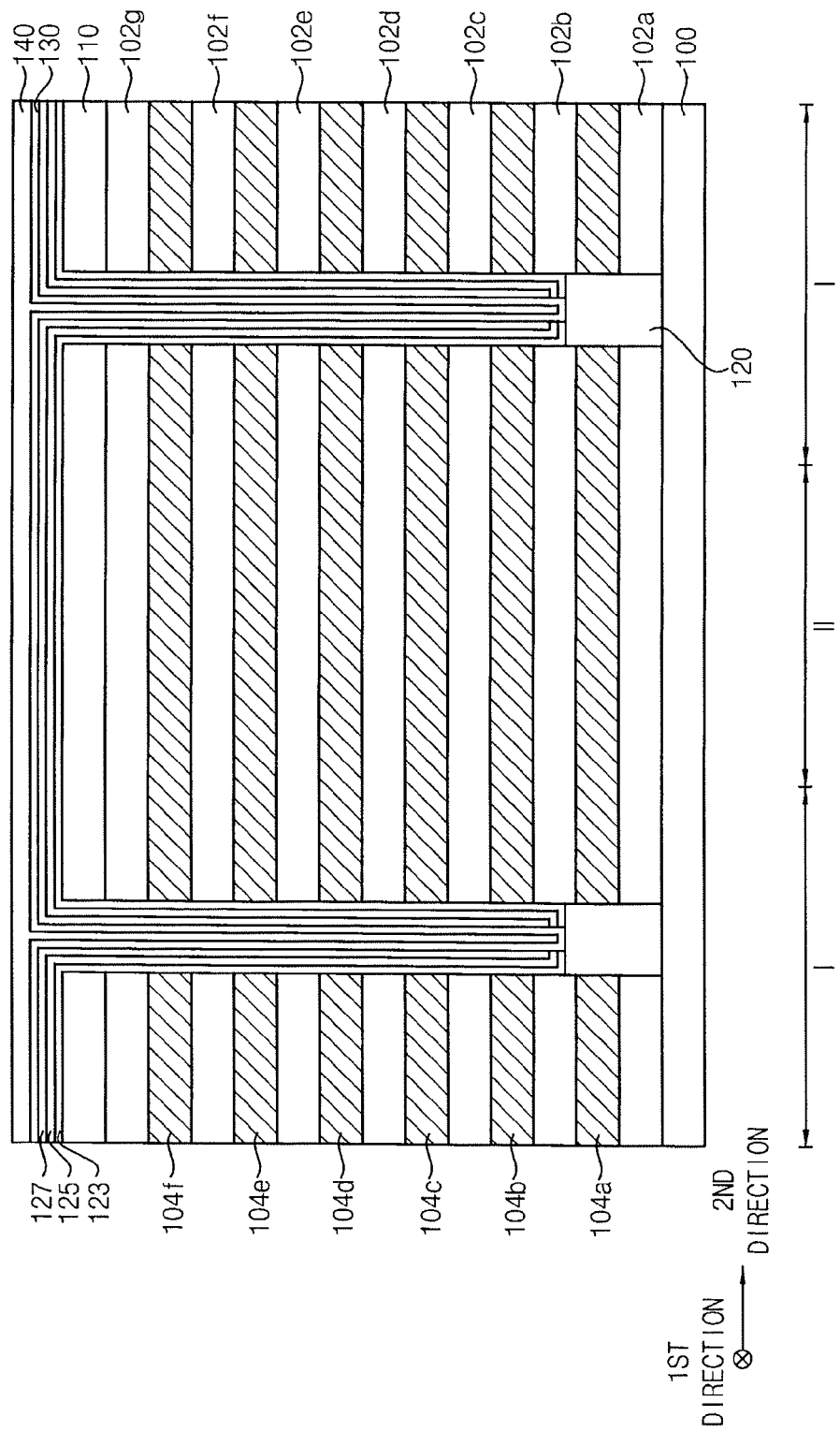

Referring to FIG. 9, a channel layer 130 may be formed on the tunnel insulation layer pattern 127 and the top surface of the semiconductor pattern 120. A first filling layer 140 may be formed on the channel layer 130 to sufficiently fill remaining portions of the channel holes 115. The channel layer 130 may be formed using polysilicon or amorphous silicon. In one example embodiment, p-type impurities, e.g., boron, may be implanted in the channel layer 130. The first filling layer 140 may be formed using an insulation material, e.g., silicon oxide. The channel layer 130 and the first filling layer 140 may be formed by a CVD process, a PECVD process, a sputtering process, an ALD process, etc.

In one example embodiment, a heat treatment or a laser beam irradiation may be further performed on the channel layer 130. In this case, the channel layer 130 may include single crystalline silicon and defects in the channel layer 130 may be cured.

In one example embodiment, the channel layer 130 may be formed to fully fill the channel hole 115. In this case, the formation of the first filling layer 140 may be omitted.

Figure 10:
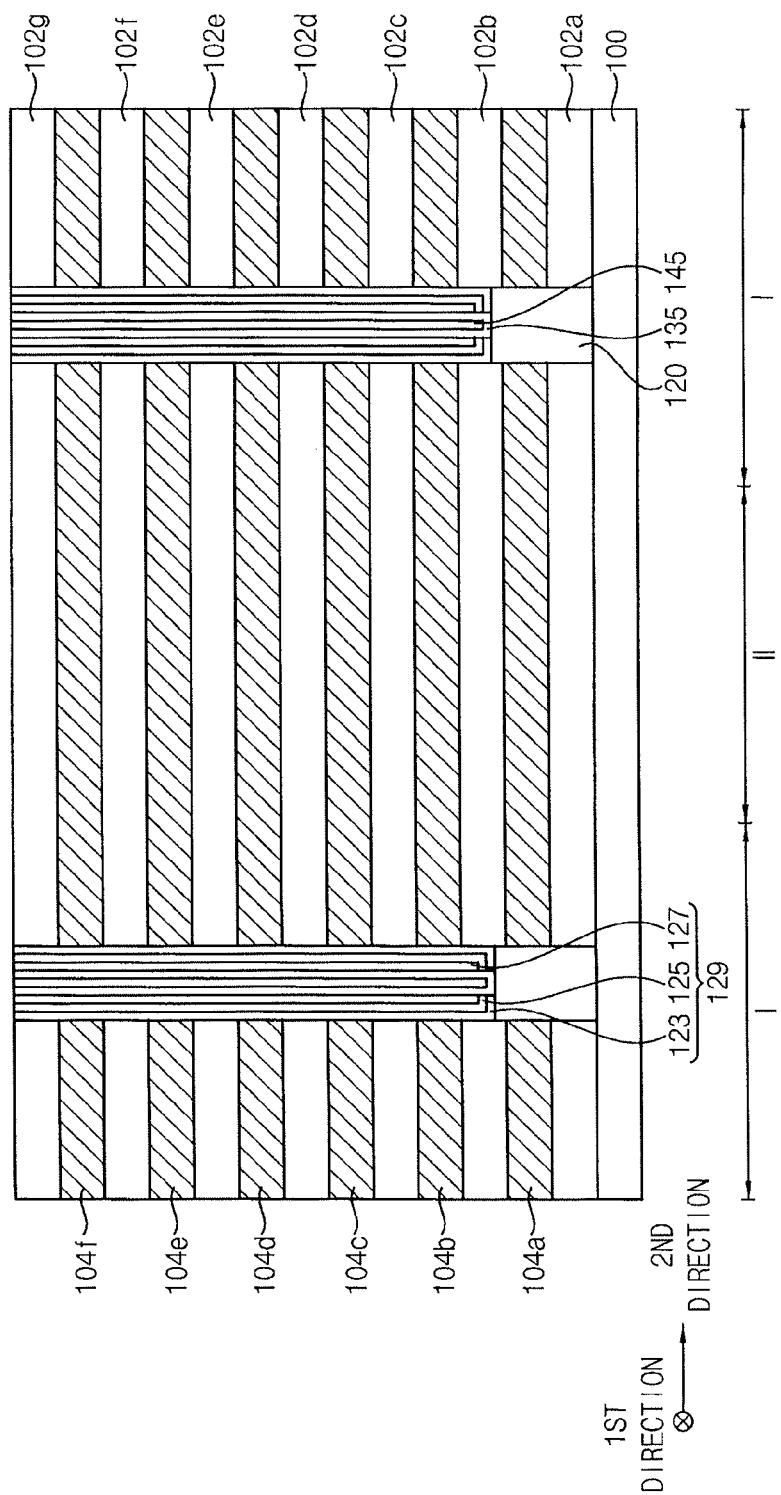

Referring to FIG. 10, the first filling layer 140, the channel layer 130, the tunnel insulation layer pattern 127, the charge storage layer pattern 125, the first blocking layer pattern 123, and the hard mask 110 may be planarized until a top surface of the uppermost insulating interlayer 102, e.g., the insulating interlayer 102g, is exposed to form the channel 135 and a first filling layer pattern 145 filling the channel hole 115. The planarization process may include, e.g., an etch-back process or a chemical mechanical polish (CMP) process.

Additionally, a stacked structure including the first blocking layer pattern 123, the charge storage layer pattern 125, and the tunnel insulation layer pattern 127 may be formed on the sidewall of the channel hole 115. Hereinafter, the stacked structure is referred to as a dielectric layer structure 129.

In example embodiments, the dielectric layer structure 129 may have a substantially hollow cylindrical shape or a straw shape. The channel 135 may have a substantial, e.g., approximate, cup shape. The first filling layer pattern 145 may have a substantially solid cylindrical shape or a substantial, e.g., approximate, pillar shape. In the case that the channel layer 130 fully fills the channel hole 115, the channel 135 may have a substantially solid cylindrical shape or a substantial pillar shape.

A plurality of the channels 135 may be arranged in the first direction to form a channel row comparable to the channel hole row.

Figure 11:
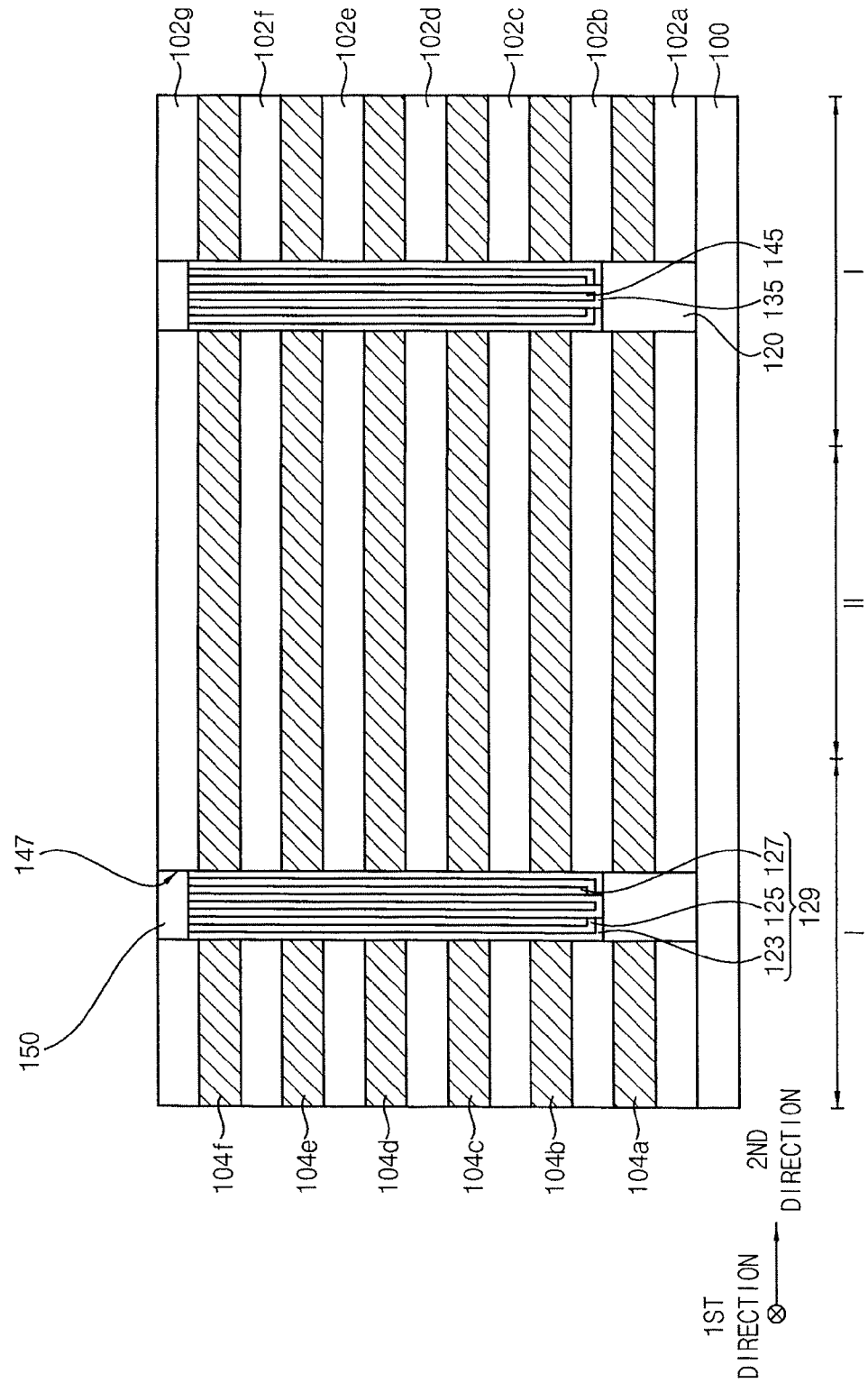

Referring to FIG. 11, the pad 150 capping an upper portion of the channel hole 115 may be formed on the dielectric layer structure 129, the channel 135, and the first filling layer pattern 145.

In example embodiments, upper portions of the dielectric layer structure 129, the channel 135, and the first filling layer pattern 145 may be removed by an etch-back process to form a recess 147. A pad layer sufficiently filling the recess 147 may be formed on the dielectric layer structure 129, the channel 135, the first filling layer pattern 145, and the uppermost insulating interlayer 102g. An upper portion of the pad layer may be planarized until the top surface of the uppermost insulating interlayer 102g is exposed to obtain the pad 150. In example embodiments, the pad layer may be formed using polysilicon or polysilicon doped with n-type impurities by, e.g., a CVD process. In one example embodiment, a preliminary pad layer may be formed using amorphous silicon, and then a crystallization process may be performed thereon to form the pad layer. The planarization process may include a CMP process.

Figure 12:
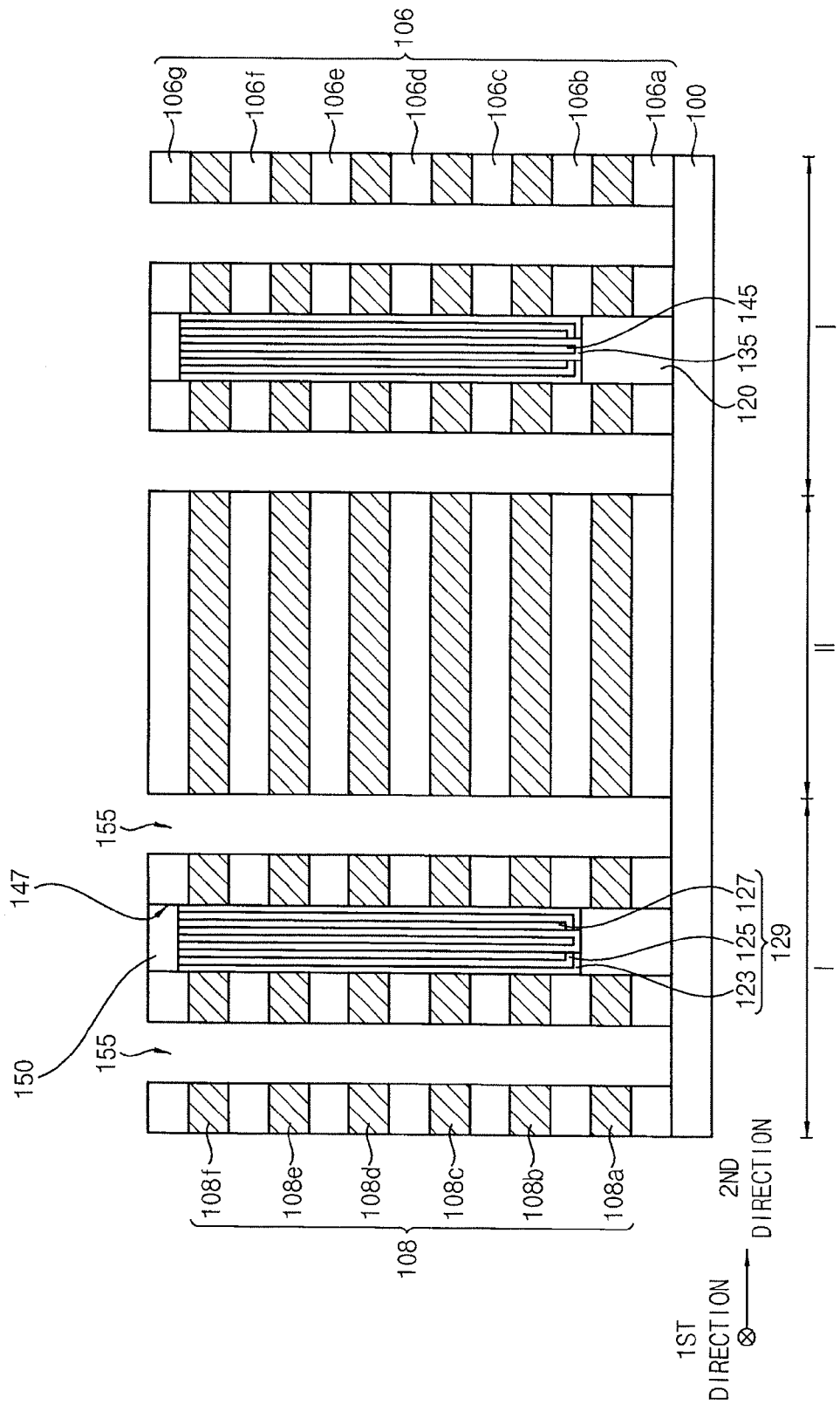

Referring to FIG. 12, openings 155 may be formed through the insulating interlayers 102 and the sacrificial layers 104 on the cell region I. For example, a mask pattern (not illustrated) covering the pads 150 may be formed on the mold structure 105. A dry etching process may be performed using the mask pattern as an etching mask, such that portions of the insulating interlayers 102 and the sacrificial layers 104 between the neighboring channel rows may be removed to form the openings 155.

In example embodiments, the opening 155 may extend in the first direction, and a plurality of the openings 155 may be formed in the second direction. The opening 155 may serve as a gate line cut region.

The insulating interlayers 102 and the sacrificial layers 104 may be changed, e.g., converted, into the insulating interlayer patterns 106 and sacrificial layer patterns 108, respectively, by the formation of the openings 155. The insulating interlayer pattern 106 and the sacrificial layer pattern 108 of each level may extend in the first direction. The top surface of the substrate 100 may be exposed by the opening 155. In one example embodiment, at least two channel rows may be arranged between openings 155 neighboring each other in the second direction.

Figure 13A:
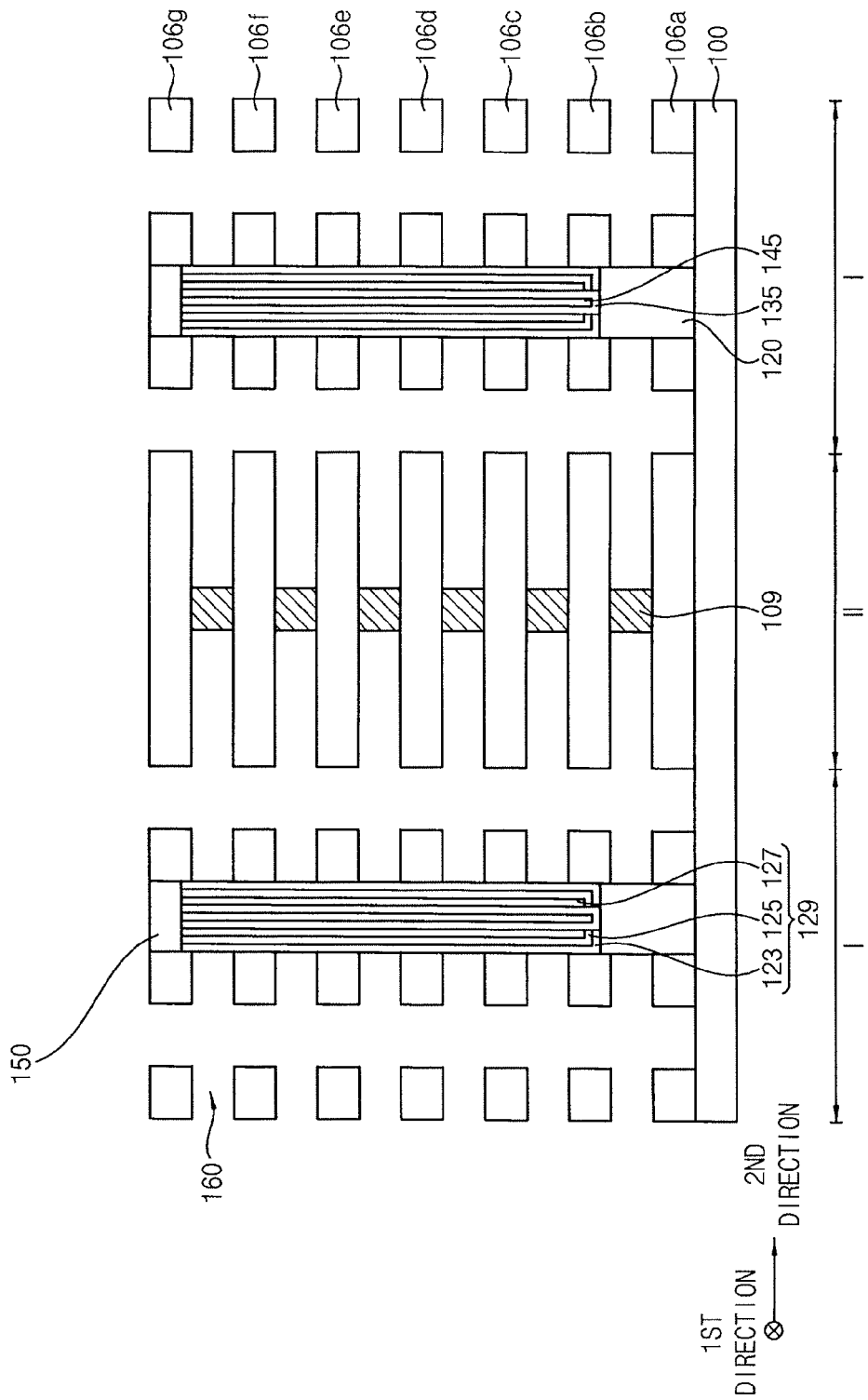

Referring to FIG. 13A, the sacrificial layer patterns 108, sidewalls of which are exposed by the openings 155, may be removed. The gap 160 may be defined by a region from which the sacrificial layer pattern 108 is removed. A plurality of the gaps 160 may be formed along the first direction, and each gap 160 may be formed between the adjacent insulating interlayer patterns 106. An outer sidewall of the dielectric layer structure 129 may be partially exposed by the gap 160.

In example embodiments, the sacrificial layer pattern 108 may be removed by a gas phase etching (GPE) process or a dry etching process using a chlorine gas. In one example embodiment, the sacrificial layer pattern 108 may be removed by a wet etching process using an etchant solution that may contain a hydroxyl group. The etchant solution may include, e.g., ammonium hydroxide ($NH_4OH$), tetramethyl ammonium hydroxide (TMAH), tetraethyl ammonium hydroxide (TEAH), sodium hydroxide (NaOH) or potassium hydroxide (KOH). These may be used alone or in a combination thereof.

In example embodiments, the sacrificial layer pattern 108 may include polysilicon or amorphous silicon, so that the sacrificial layer pattern 108 may have an excellent etching selectivity with respect to the insulating interlayer pattern 106. Thus, the sacrificial layer pattern 108 may be selectively removed without causing an etching damage of the insulating interlayer pattern 106.

In contrast, if the sacrificial layer pattern is formed using a nitride-based material, e.g., silicon nitride, a sufficient etching selectivity with respect to the insulating interlayer pattern 106 may not be achieved. Thus, the insulation interlayer pattern 106 may be partially removed with the nitride-based sacrificial layer pattern during the etching process.

Additionally, when a plurality of silicon nitride layers is stacked, a thermal stress may be accumulated in the mold structure 105 to cause a deformation thereof. The deformation of the mold structure may result in a misalignment of various structures, e.g., a common source line (CSL), contacts, or wirings. Further, attempts to increase thickness of the insulating interlayers to prevent such deformation, e.g., a greater thickness than a required thickness or an initially designed thickness, may cause the mold structure and the vertical memory device to have an overall increased height.

According to example embodiments, the sacrificial layer pattern 108 may be selectively removed without damaging the insulating interlayer pattern 106. Therefore, the misalignment caused by the deformation of the mold structure may be prevented and the height of the mold structure may be reduced.

In example embodiments, the sacrificial layer patterns 108 may partially remain on the dummy region II to form the supporting patterns 109. The insulating interlayer pattern 106 may be supported on the dummy region II by the supporting pattern 109 at each level, so that a collapse or a bending of the insulating interlayer pattern 106 may be prevented.

In one example embodiment, as illustrated in FIG. 13B, a lateral portion of the semiconductor pattern 120a in contact with a lowermost sacrificial layer pattern 108a may be partially removed together with the sacrificial layer patterns 108 to form the first recess 162. For example, in the case that the semiconductor pattern 120a is formed by the SEG process in the absence of dopants or impurities, the semiconductor pattern 120a may have a composition substantially the same as or similar to that of the sacrificial layer pattern 108. Thus, the lateral portion of the semiconductor pattern 120a may be partially etched to form the first recess 162. In another example, in the case that the semiconductor pattern 120 is formed by the SEG process in a presence of dopants or impurities, the first recess 162 may not be formed.

In one example embodiment, as illustrated in FIG. 13B, an upper portion of the substrate 100 exposed by the opening 155 may be also partially removed to form the second recess 164. For example, if the substrate 100 includes single crystalline silicon, the substrate 100 may be also partially etched during the etching process for removing the sacrificial layer patterns 108 that includes polysilicon or amorphous silicon. Single crystalline silicon has a bonding energy stronger than that of polysilicon or amorphous silicon, so that a depth or a size of the second recess 164 may be controlled to avoid a loss of a function of the substrate 100.

Hereinafter, subsequent processes are described with reference to the structure illustrated in FIG. 13A.

Referring to FIG. 14, a gate electrode layer 170 may be formed on the sidewalls of the dielectric layer structure 129, surfaces of the insulating interlayer patterns 106, the top surface of the substrate 100, and a top surface of the pad 150. The gate electrode layer 170 may sufficiently, e.g., completely, fill the gaps 160 and may partially fill the openings 155.

The gate electrode layer 170 may be formed using a metal or a metal nitride. For example, the gate electrode layer 170 may be formed using tungsten, tungsten nitride, titanium, titanium nitride, tantalum, tantalum nitride, platinum, etc. In one example embodiment, the gate electrode layer 170 may be formed as a multi-layered structure including a barrier layer formed of the metal nitride, and a metal layer. The gate electrode layer 170 may be formed by a CVD process, a PECVD process, an ALD process, a physical vapor deposition (PVD) process, a sputtering process, etc.

In one example embodiment, a second blocking layer (not illustrated) may be further formed along inner walls of the gaps 160 and the surfaces of the insulating interlayer patterns 106 before forming the gate electrode layer 170.

Figure 15:
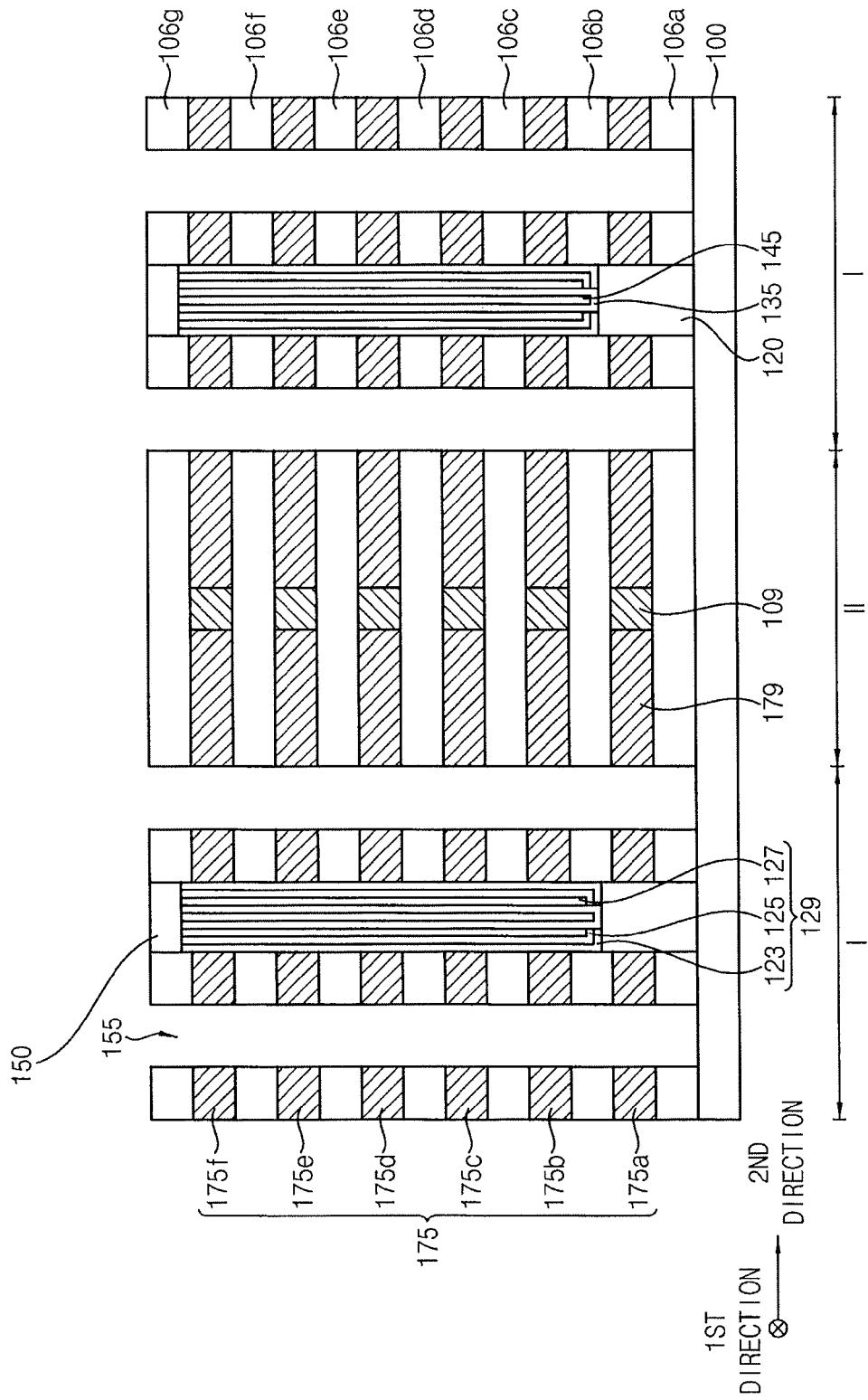

Referring to FIG. 15, the gate electrode layer 170 may be partially removed to form the gate line 175 in each gap 160. For example, an upper portion of the gate electrode layer 170 may be planarized until the uppermost insulating interlayer pattern 106g is exposed. A portion of the gate electrode layer 170 formed in the opening 155 may be etched to obtain the gate lines 175. A portion of the gate electrode layer 170 which is formed on the top surface of the substrate 100 may be also removed during the etching process.

In example embodiments, the planarization process may include a CMP process. The gate electrode layer 170 may be partially etched by a wet etching process using an etchant solution that may contain hydrogen peroxide ($H_2O_2$).

The gate lines 175 may include the GSL, the word line, and the SSL sequentially stacked and spaced apart from each other in the vertical direction. For example, the lowermost gate line 175a may serve as the GSL. Four gate lines 175b, 175c, 175d, and 175e on the GSL may serve as the word lines. The uppermost gate line 175f on the word lines may serve as the SSL. The gate line 175 at each level may surround the dielectric layer structure 129 and extend in the first direction.

In example embodiments, a portion of the gate electrode layer 170 formed on the dummy region II may be partially etched to form dummy gates 179 filling the gaps 160 on the dummy region II. Accordingly, the supporting pattern 109 and the dummy gates 179 at both lateral portions of the supporting pattern 109 may be formed at each level between the insulating interlayer patterns 106 of the dummy region II.

Figure 16:
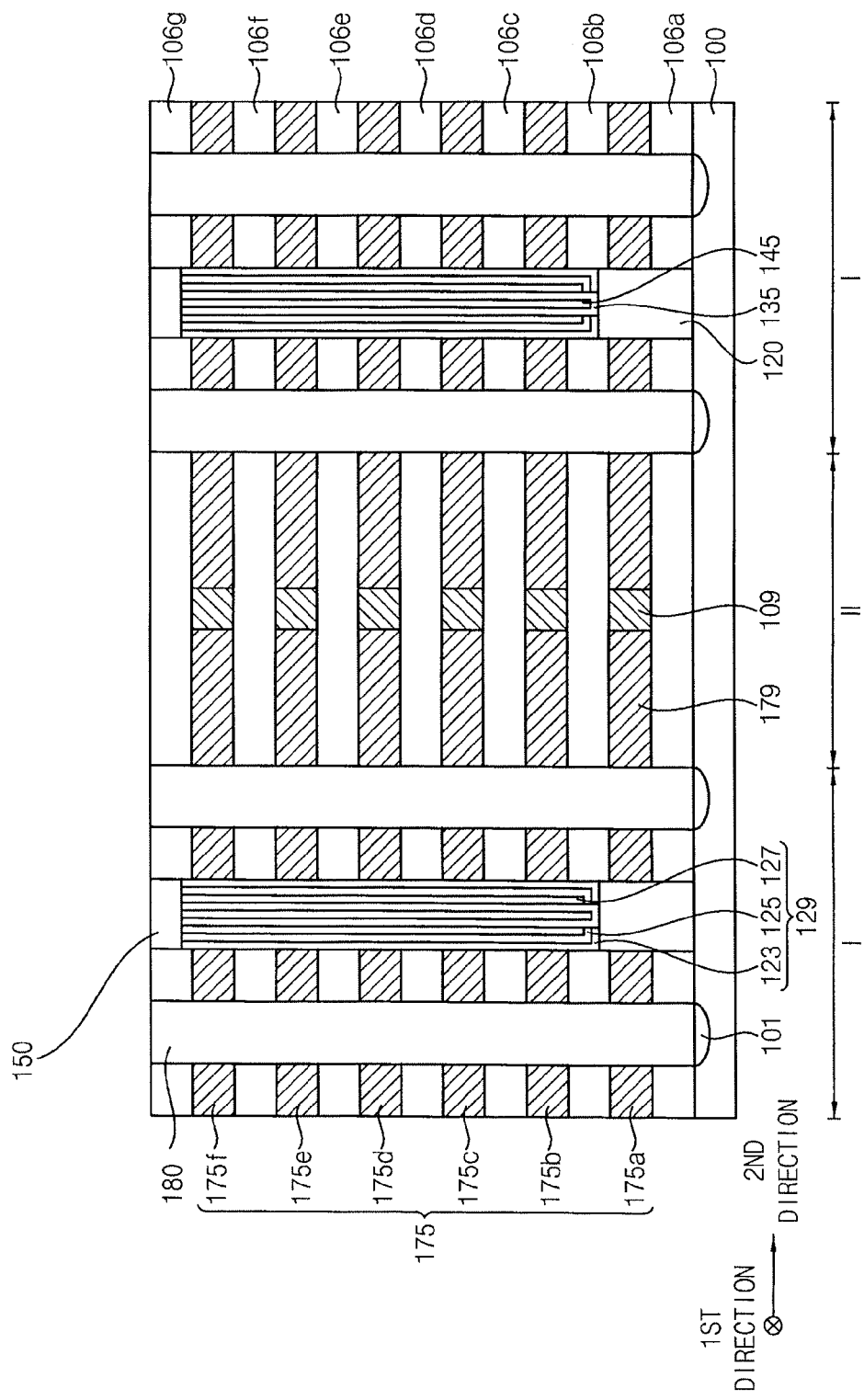

Referring to FIG. 16, the impurity region 101 may be formed at an upper portion of the substrate 100 exposed by the opening 155, and the second filling layer pattern 180 filling the opening 155 may be formed on the impurity region 101.

For example, an ion implantation mask (not illustrated) covering the pads 150 may be formed on the uppermost insulating interlayer pattern 106g. N-type impurities, e.g., phosphorous or arsenic, may be implanted through the opening 155 to form the impurity region 101. The impurity region 101 may extend in the first direction and serve as a CSL. In one example embodiment, a metal silicide pattern, e.g., a cobalt silicide pattern or a nickel silicide pattern, may be further formed on the impurity region 101.

A second filling layer may be formed on the substrate 100, the uppermost insulating interlayer pattern 106g, and the pad 150 to sufficiently, e.g., completely, fill the openings 155. An upper portion of the second filling layer may be planarized by, e.g., a CMP process or an etch-back process, until the uppermost insulating interlayer pattern 106g is exposed to form the second filling layer pattern 180. The second filling layer may be formed using an insulation material, e.g., silicon oxide by, e.g., a CVD process.

Figure 17A:
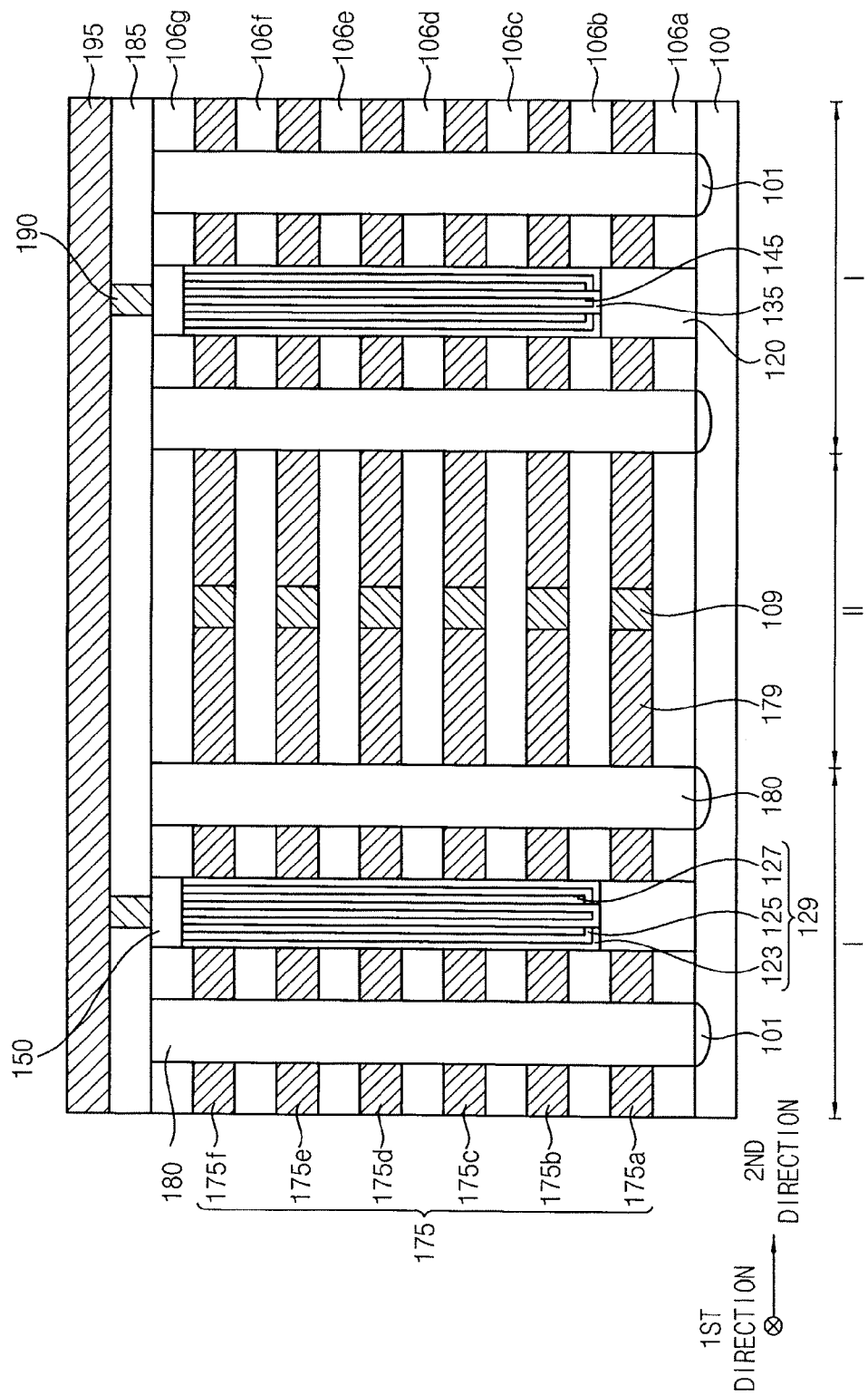

Referring to FIG. 17A, the upper insulation layer 185 may be formed on the uppermost insulating interlayer pattern 106g, the second filling layer pattern 180, and the pad 150. The upper insulation layer 185 may be formed using an insulation material, e.g., silicon oxide by, e.g., a CVD process.

The bit line contact 190 may be formed through the upper insulation layer 185 to contact the pad 150. The bit line 195 may be formed on the upper insulation layer 185 to be electrically connected to the bit line contact 190. The bit line contact 190 and the bit line 195 may be formed using a metal, a metal nitride, or doped polysilicon by a PVD process, an ALD process, or a sputtering process.

In example embodiments, a plurality of the bit line contacts 190 may be formed according to the arrangement of the pads 150 to form a bit line contact array. The bit line 195 may extend in the second direction to be electrically connected to a plurality of the pads 150. A plurality of the bit lines 195 may be formed in the first direction.

In one example embodiment, the second filling layer pattern 180 may sufficiently fill the openings 155 and cover the insulating interlayer pattern 106 and the pads 150. In this case, the formation of the upper insulation layer 185 may be omitted.

Figure 17B:
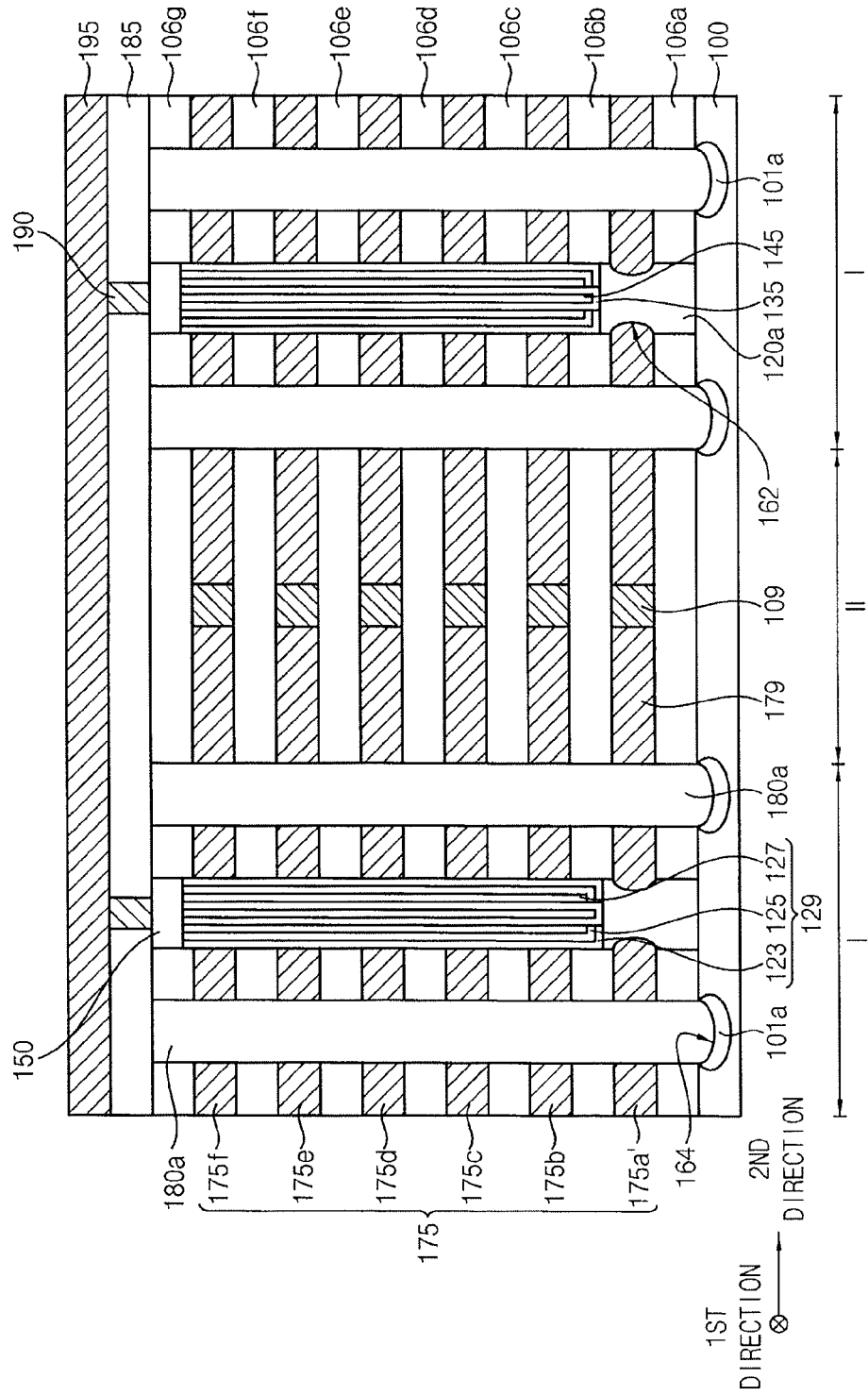

Referring to FIG. 17B, the GSL 175a' may be inserted or buried in the first recess 162 of the semiconductor pattern 120a. As described with reference to FIG. 13B, the lateral portion of the semiconductor pattern 120a may be partially etched while removing the sacrificial layer patterns 108 to form the first recess 162. In this case, the GSL 175a' may be formed to fill the first recess during the formation of the gate lines 175 as described with reference to FIGS. 14 and 15.

The GSL 175a' may have a substantially buried gate structure so that a contact area with the semiconductor pattern 120a serving as a channel may be expanded. Thus, electrical properties of a transistor including the GSL 175a' may be improved.

As illustrated in FIG. 13B, the upper portion of the substrate 100 may be partially removed together with the sacrificial layer pattern 108 to form the second recess 164. In this case, the second filling layer pattern 180a may fill the second recess 164. Further, an area of the substrate 100 through which the impurities are implanted or diffused may be expanded by the second recess 164. Thus, an impurity region 101a of FIG. 17B may have a dimension or a volume greater than that of the impurity region 101 of FIG. 16, so that an electrical resistance of the CSL may be decreased. A projected range (Rp) of the impurities may be controlled so that the dimension or the volume of the impurity region 101a may be adjusted to avoid a short-channel phenomenon between the impurity region 101a and the semiconductor pattern 120a.

FIGS. 18 to 25 illustrate cross-sectional views of stages in a method of manufacturing a vertical memory device in accordance with some example embodiments. Detailed descriptions on processes and/or materials substantially the same as or similar to those described previously with reference to FIGS. 4 to 17B may be omitted. Like reference numerals are used to indicate like elements.

Referring to FIG. 18, processes substantially the same as or similar to those described previously with reference to FIGS. 4 and 5 may be performed. Accordingly, the insulating interlayers 102 and sacrificial layers 104 may be repeatedly and alternately stacked on the substrate 100 to form the mold structure 105. The mold structure 105 may be partially etched to form the channel hole 115. The insulating interlayers 102 may be formed using silicon oxide, and the sacrificial layers 104 may be formed using polysilicon or amorphous silicon. The hard mask 110 illustrated in FIG. 5 may be removed after the formation of the channel hole 115 by an ashing and/or a strip process.

Referring to FIG. 19, lateral portions of the sacrificial layers 104 exposed by a sidewall of the channel hole 115 may be oxidized to form the barrier oxide layer pattern 117.

For example, the barrier oxide layer pattern 117 may be formed by providing oxygen ($O_2$) gas or oxygen radicals through the channel hole 115. In another example, a thermal oxidation process may be performed on the sidewall of the channel hole 115 to form the barrier oxide layer pattern 117. The sacrificial layer 104 may include polysilicon or amorphous silicon, and the insulating interlayer 102 may include silicon oxide. Thus, the sacrificial layer 104 may be selectively oxidized to form the barrier oxide layer pattern 117. The barrier oxide layer pattern 117 may include silicon oxide. Portions of the insulating interlayers 102 exposed by the channel hole 115 may be also oxidized, however, the oxidized portions may be merged with the insulating interlayers 102. A top surface of the substrate 100 exposed by the channel hole 115 may be also oxidized to be covered by the barrier oxide layer pattern 117.

In example embodiments, sidewalls of the barrier oxide layer pattern 117 and the channel hole 115 may be coplanar with each other in the vertical direction. In one example embodiment, the barrier oxide layer pattern 117 may protrude from the sidewall of the channel hole 115.

Referring to FIG. 20, the barrier oxide layer pattern formed on the top surface of the substrate 100 may be removed by, e.g., an etch-back process or a dry etching process. An upper portion of the substrate 100 in contact with the barrier oxide layer pattern 117 may be partially etched to form a recess 165.

FIGS. 19 and 20 illustrate the barrier oxide layer pattern 117 is formed by oxidizing the sidewall of the channel hole 115. In another example, a barrier oxide layer may be formed on an inner wall of the channel hole 115 using, e.g., silicon oxide by a CVD process. A portion of the barrier oxide layer formed on the substrate 100 may be removed to form the barrier oxide layer pattern 117. Portions of the barrier oxide layer formed on the insulating interlayers 102 may be merged with the insulating interlayers 102.

Figure 21:
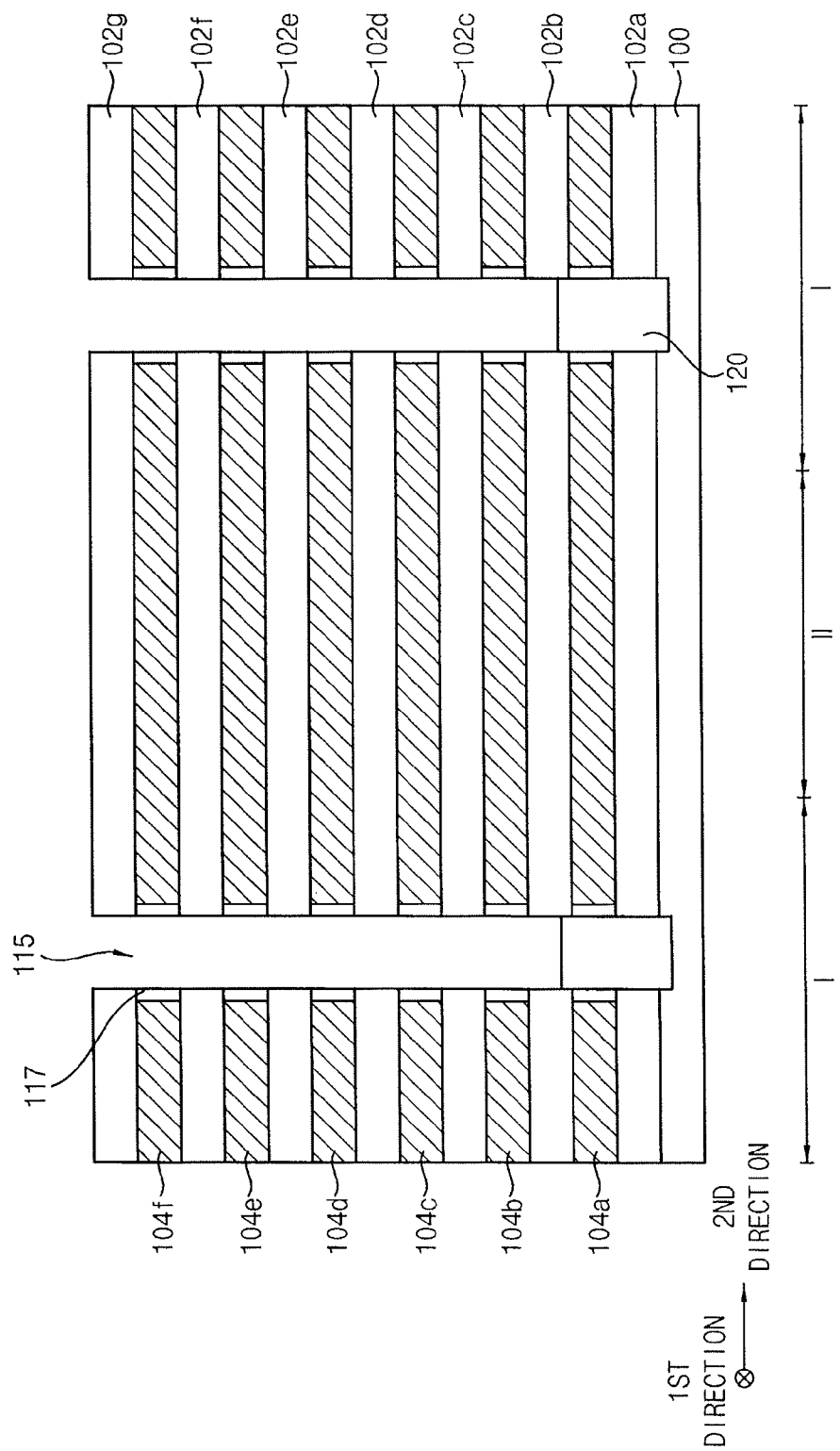

Referring to FIG. 21, a process substantially the same as or similar to that described previously with reference to FIG. 6 may be performed to form the semiconductor pattern 120. In example embodiments, the sacrificial layer 104 including polysilicon may be blocked by the barrier oxide layer pattern 117. Thus, the sacrificial layer 104 may not be exposed by the sidewall of the channel hole 115. Accordingly, the SEG process may proceed only from the top surface of the substrate 100 so that a height, a thickness, or a composition of the semiconductor pattern 120 may be easily controlled.

Figure 22:
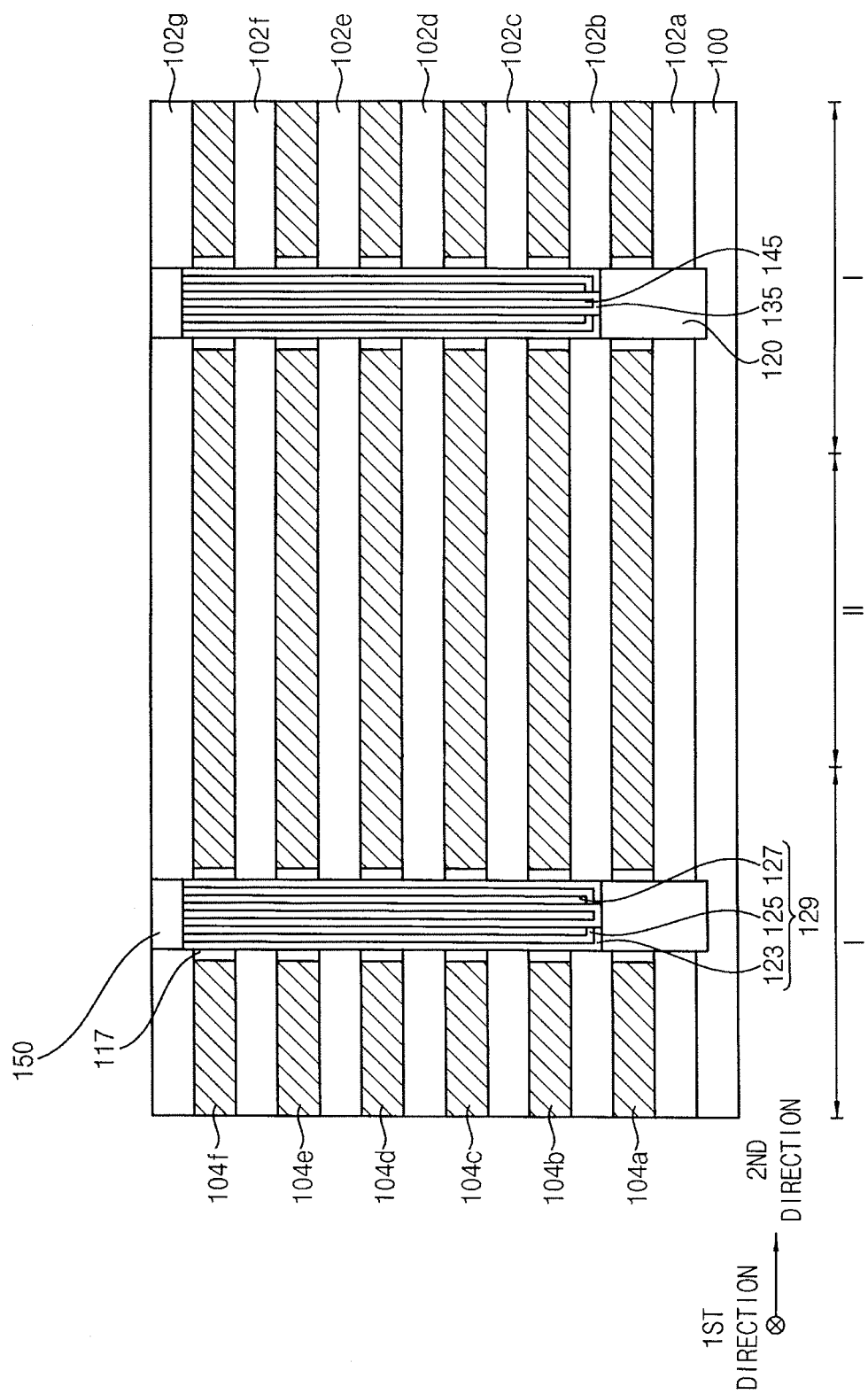

Referring to FIG. 22, processes substantially the same as or similar to those described previously with reference to FIGS. 7 to 11 may be performed. Accordingly, the dielectric layer structure 129, the channel 135, and the first filling layer pattern 145 partially filling the channel hole 115 may be formed on the semiconductor pattern 120. The pad 150 capping the channel hole 115 may be formed on the dielectric layer structure 129, the channel 135, and the first filling layer pattern 145. The dielectric layer structure 129 may include the first blocking layer pattern 123, the charge trapping layer pattern 125, and the tunnel insulation layer pattern 127, sequentially formed from the sidewall of the channel hole 115.

Figure 23:
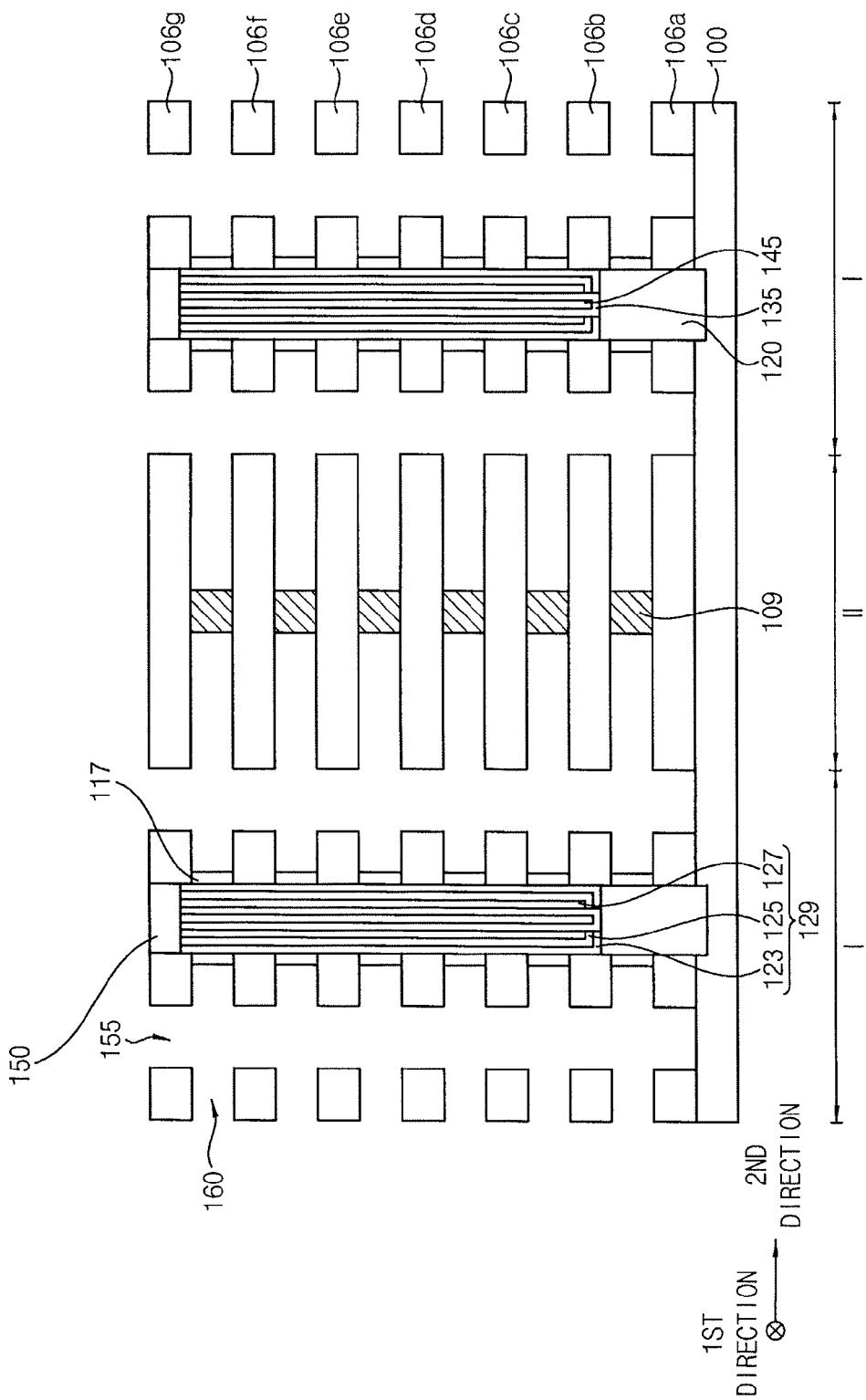

Referring to FIG. 23, processes substantially the same as or similar to those described previously with reference to FIGS. 12 and 13A may be performed. In example embodiments, the mold structure 105 may be partially etched to form the openings 155, the insulating interlayer patterns 106, and the sacrificial layer patterns. The sacrificial layer patterns exposed by the openings 155 may be removed to form the gaps 160 between the insulating interlayer patterns 106 neighboring each other in the vertical direction.

In example embodiments, the barrier oxide layer pattern 117 may not be removed to remain in the gap 160. Thus, a sidewall of the barrier oxide layer pattern 117 may be exposed in each gap 160. Portions of the sacrificial layer patterns may remain on the dummy region II to form the supporting patterns 109.

Figure 24:
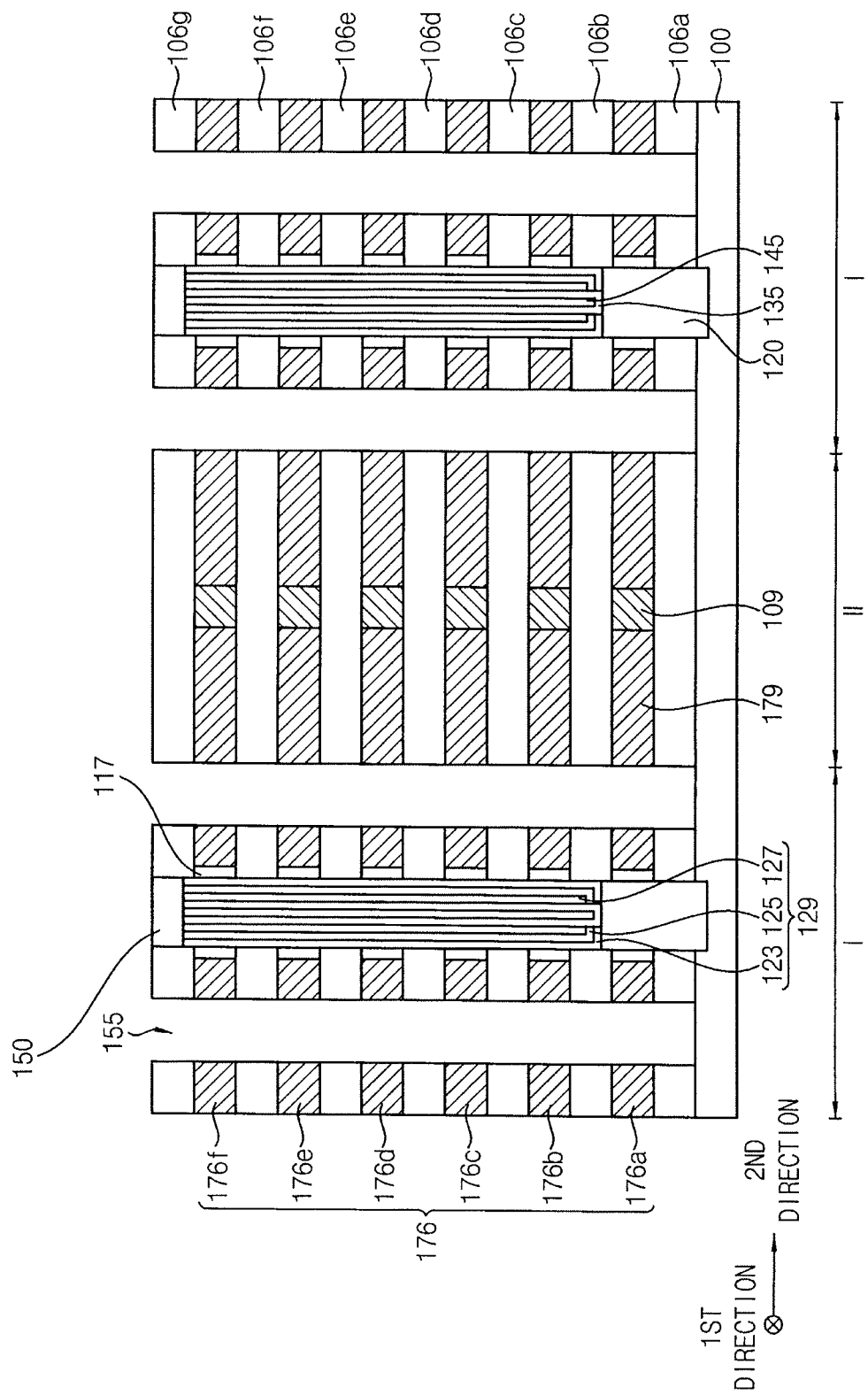

Referring to FIG. 24, processes substantially the same as or similar to those described previously with reference to FIGS. 14 and 15 may be performed. Accordingly, the gate line 176 may be formed in each gap 160. The dummy gate 179 may be formed in each gap 160 on the dummy region II.

The lowermost gate line 176a may serve as a GSL. Four gate lines 176b, 176c, 176d, and 176e on the GSL may serve as word lines. The uppermost gate line 176f may serve as an SSL.

In example embodiments, the gate line 176 may be in contact with the barrier oxide layer pattern 117 and extend in the first direction. The barrier oxide layer pattern 117 may be disposed between the gate line 176 and the dielectric layer structure 129 to serve as a second blocking layer pattern. The barrier oxide layer pattern 117 disposed between the GSL 176a and the semiconductor pattern 120 may solely serve as a gate insulation layer.

Figure 25:
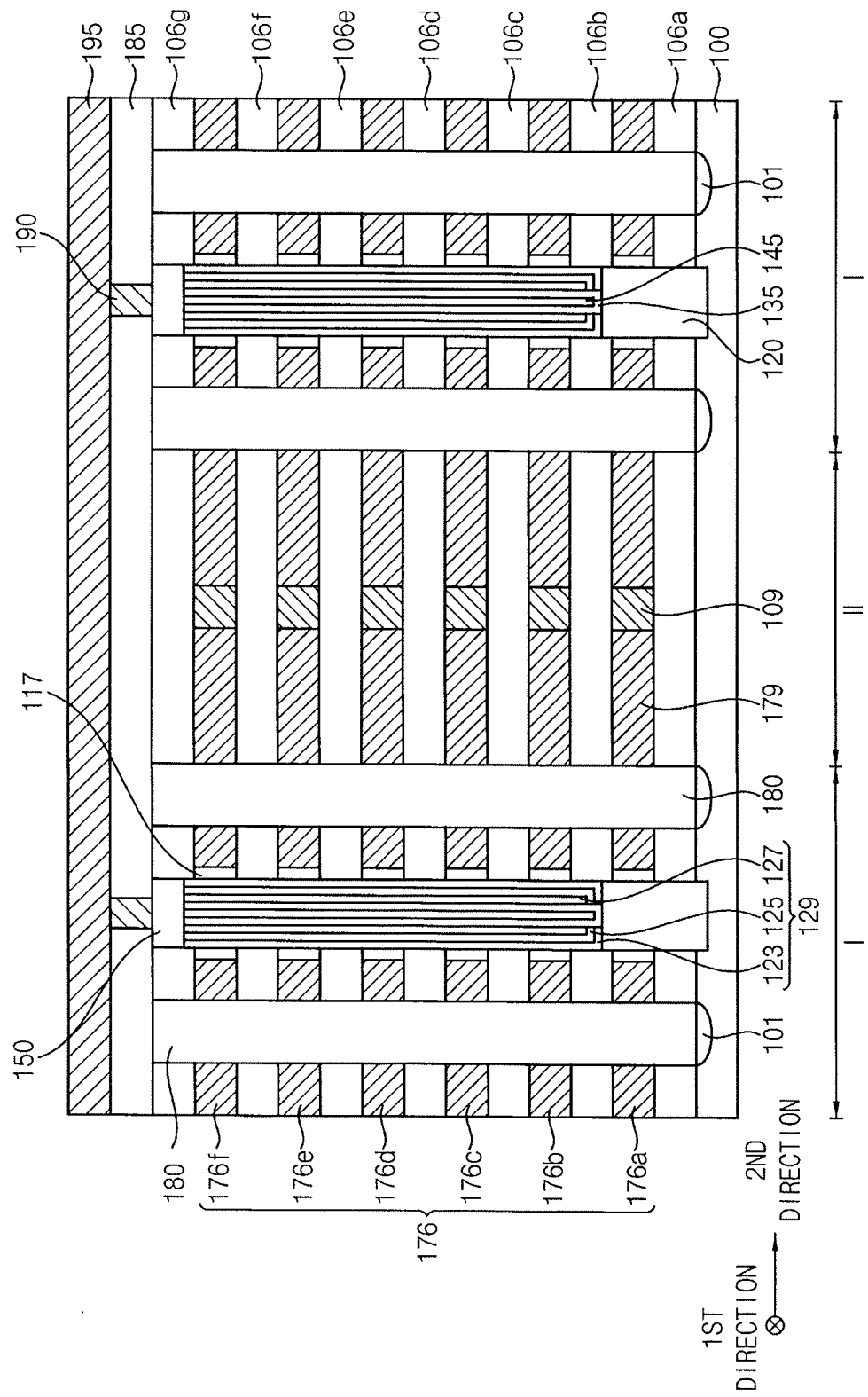

Referring to FIG. 25, processes substantially the same as or similar to those described previously with reference to FIGS. 16 and 17A may be performed. Accordingly, the impurity region 101 may be formed at the upper portion of the substrate 100 exposed by the opening 155 to serve as a CSL. The second filling layer pattern 180 filling the opening 155 may be formed on the impurity region 101. The upper insulation layer 185 may be formed on the insulating interlayer pattern 106, the pad 150, and the second filling layer pattern 180. The bit line contact 190 may be formed through the upper insulation layer 185 to contact the pad 150. The bit line 195 may be formed on the upper insulation layer 185 to be electrically connected to the pad 150 via the bit line contact 190.

As described with reference to FIGS. 18 to 25, the barrier oxide layer pattern 117 may remain in the gap 160 to be utilized as the second blocking layer pattern or the gate insulation layer. However, the barrier oxide pattern 115 may be removed after forming the semiconductor pattern 120 (see FIG. 21). For example, the barrier oxide layer pattern 117 may be removed by a wet etching process using a hydrofluoric acid solution.

FIGS. 26 to 30 illustrate cross-sectional views of stages in a method of manufacturing a vertical memory device in accordance with some example embodiments. Detailed descriptions of processes and/or materials substantially the same as or similar to those described previously with reference to FIGS. 4 to 17B may be omitted. Like reference numerals are used to indicate like elements.

Figure 26:
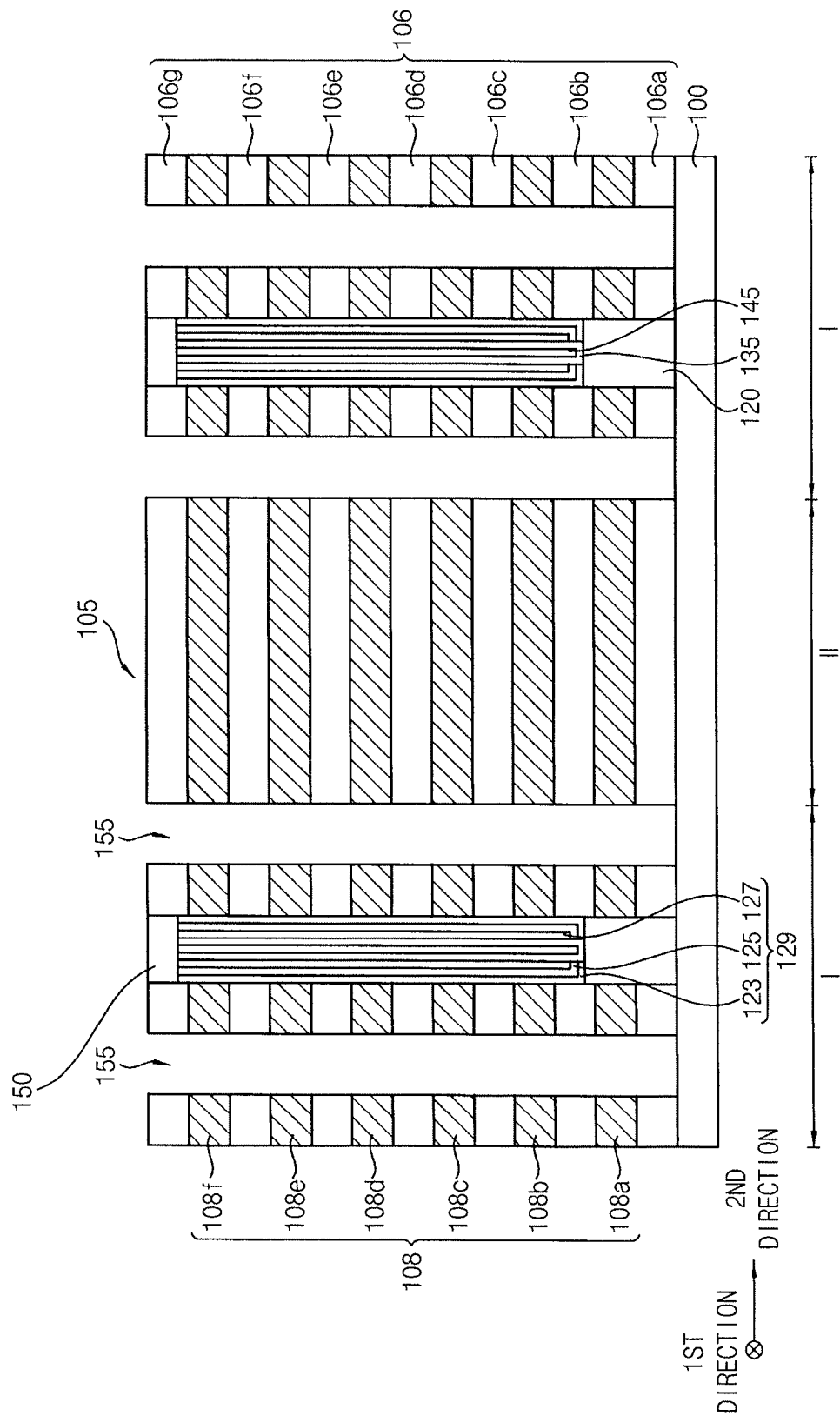

Referring to FIG. 26, processes substantially the same as or similar to those described previously with reference to FIGS. 4 to 12 may be performed. Accordingly, the channel hole 115 may be formed through the mold structure 105. The semiconductor pattern 120, the dielectric layer structure 129, the channel 135, the first filling layer pattern 14,5 and the pad 150 may be formed in the channel hole 115. The openings 155 extending in the first direction on the cell region I may be formed through the mold structure 105. The insulating interlayer patterns 106 and sacrificial layer patterns 108 may be formed by the formation of the openings 155.

Figure 27:
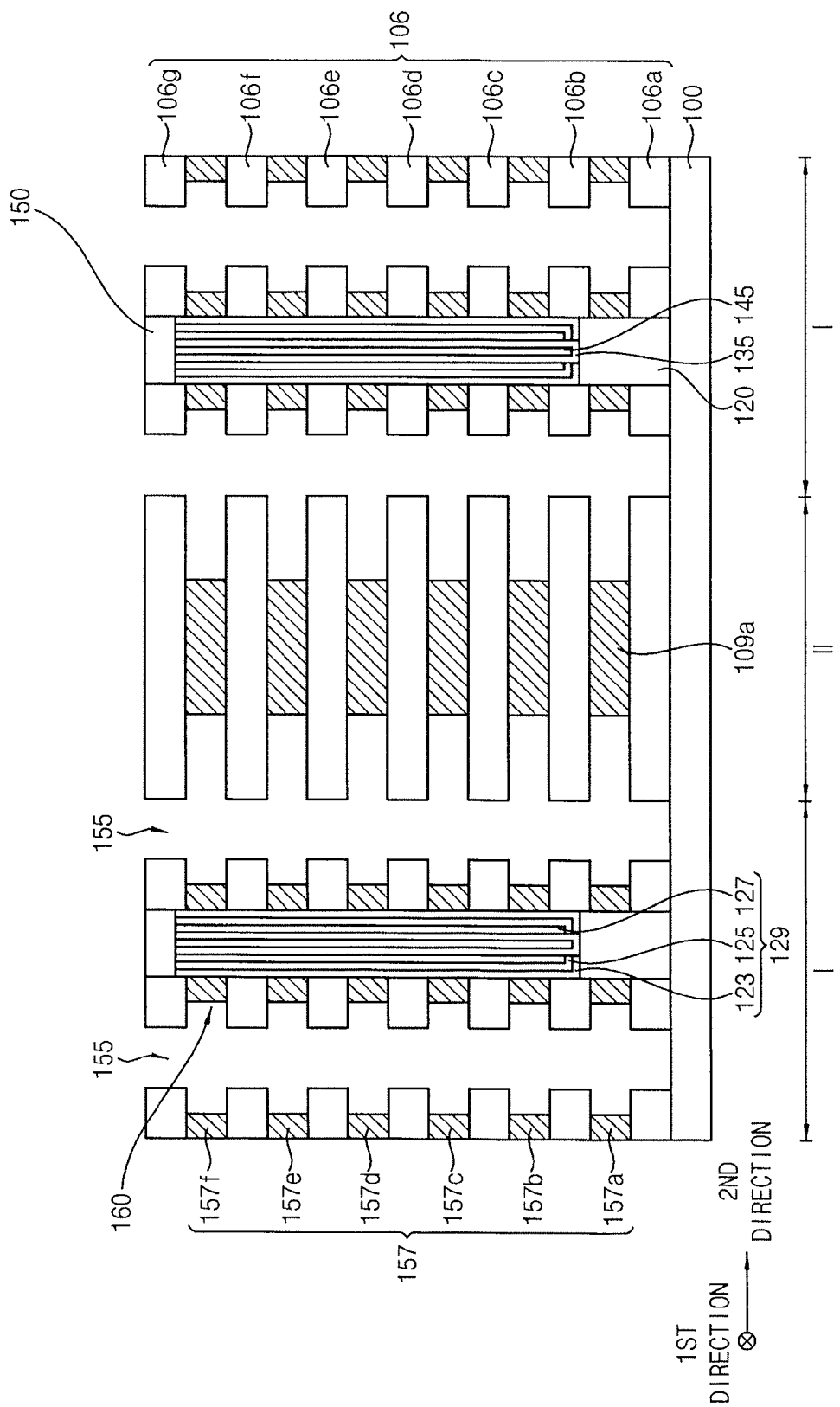

Referring to FIG. 27, a process substantially the same as or similar to that described previously with reference to FIG. 13A may be performed to partially remove the sacrificial layer patterns 108.

In example embodiments, an etching rate for removing the sacrificial layer patterns 108 may be maintained less than that for the process of FIG. 13A. Thus, the sacrificial layer patterns 108 may remain in both cell and dummy regions I and II. Accordingly, a preliminary gate line 157 may be formed at each level of the cell region I between insulating interlayer patterns 106. The preliminary gate line 157 may be formed on a sidewall of the dielectric layer structure 129 or a sidewall of the semiconductor pattern 120 to partially fill the gap 160.

The sacrificial layer patterns 108 on the dummy region II may be partially removed to form a supporting pattern 109a at each level of the dummy region II between the insulating interlayer patterns 106. The supporting pattern 109a of FIG. 27 may have a width greater than that of the supporting pattern 109 of FIG. 13A.

Figure 28:
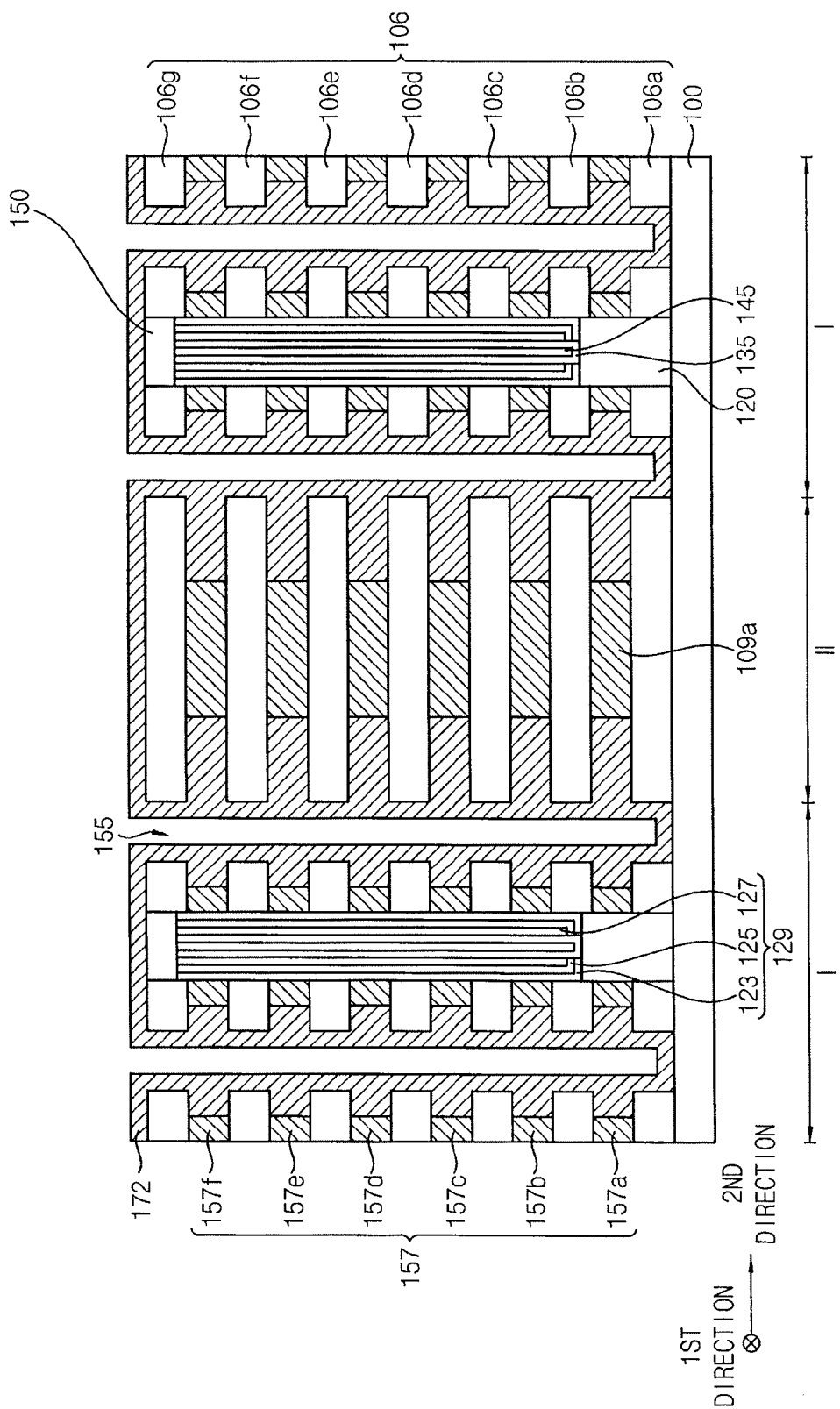

Referring to FIG. 28, a metal layer 172 filling remaining portions of the gaps 160 and partially filling the openings 155 may be formed. The metal layer 172 may also cover the uppermost insulating interlayer pattern 106g, the pad 150, and the top surface of the substrate 100 exposed by the opening 155.

In example embodiments, the metal layer 172 may be formed using a metal that is reactive for a silicidation. The metal layer 172 may be formed using, e.g., cobalt or nickel by a PVD process, an ALD process, a sputtering process or a CVD process.

Figure 29:
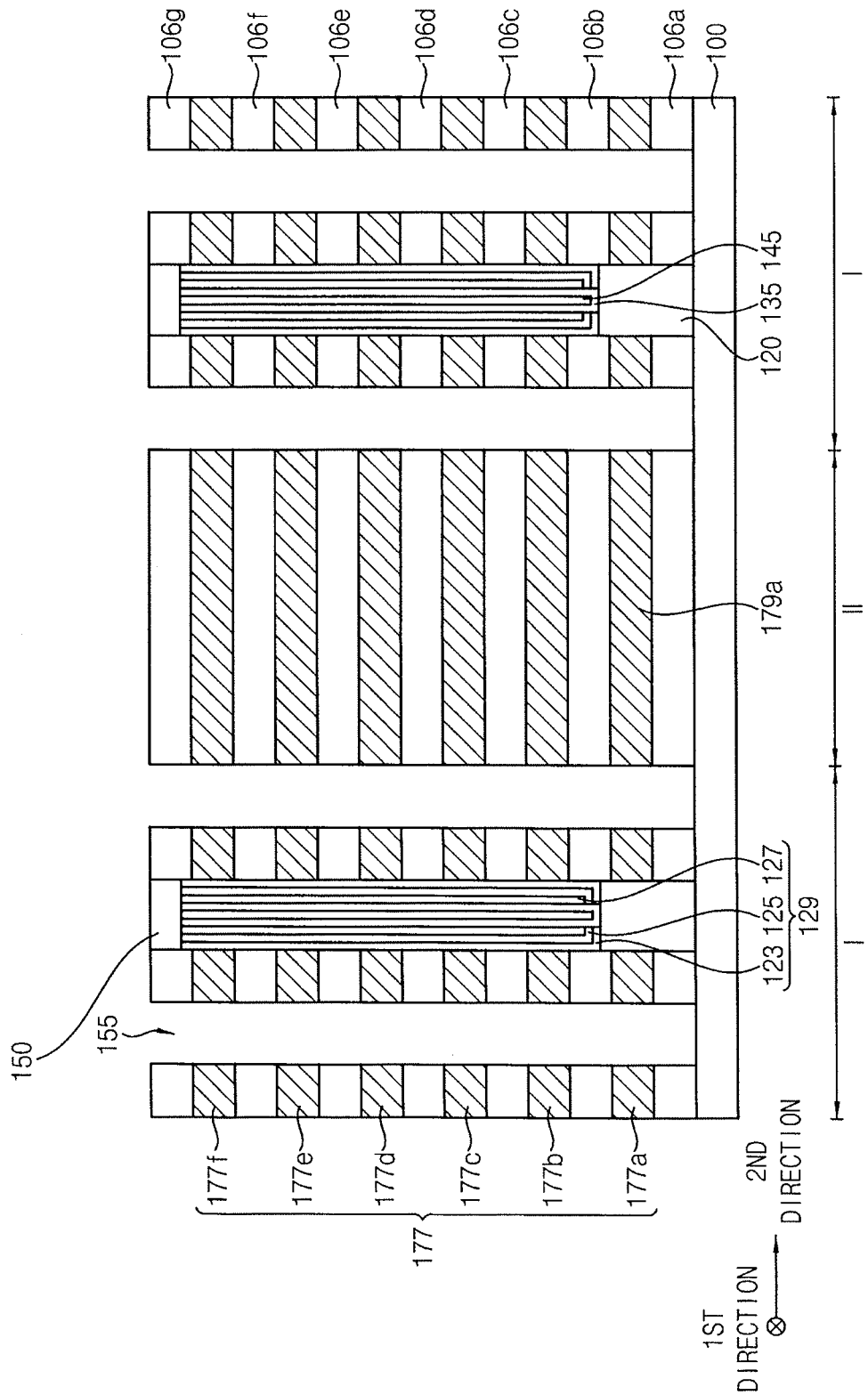

Referring to FIG. 29, the silicidation may be caused between the metal layer 172 and the preliminary gate line 157 by, e.g., a heat treatment. In example embodiments, polysilicon or amorphous silicon contained in the preliminary gate line 157 may be reacted with the metal layer 172 to be transformed into a metal silicide.

Therefore, the gate line 177 including the metal silicide may be formed at each level of the cell region I between the insulating interlayer patterns 106. If the metal layer 172 includes cobalt, the gate line 177 may include cobalt silicide. If the metal layer 172 includes nickel, the gate line 177 may include nickel silicide.

The lowermost gate line 177a may serve as a GSL. The four gate lines 177b, 177c, 177d and 177e may serve as word lines. The uppermost gate line 177f may serve as an SSL.

A remaining portion of the metal layer 172 which is not reacted with the preliminary gate line 157 may be removed by, e.g., a dry etching process.

In example embodiments, a dummy gate 179a including the metal silicide may be formed at each level of the dummy region II between the insulating interlayer patterns 106 by silicidation between the metal layer 172 and the supporting pattern 109a.

Figure 30:
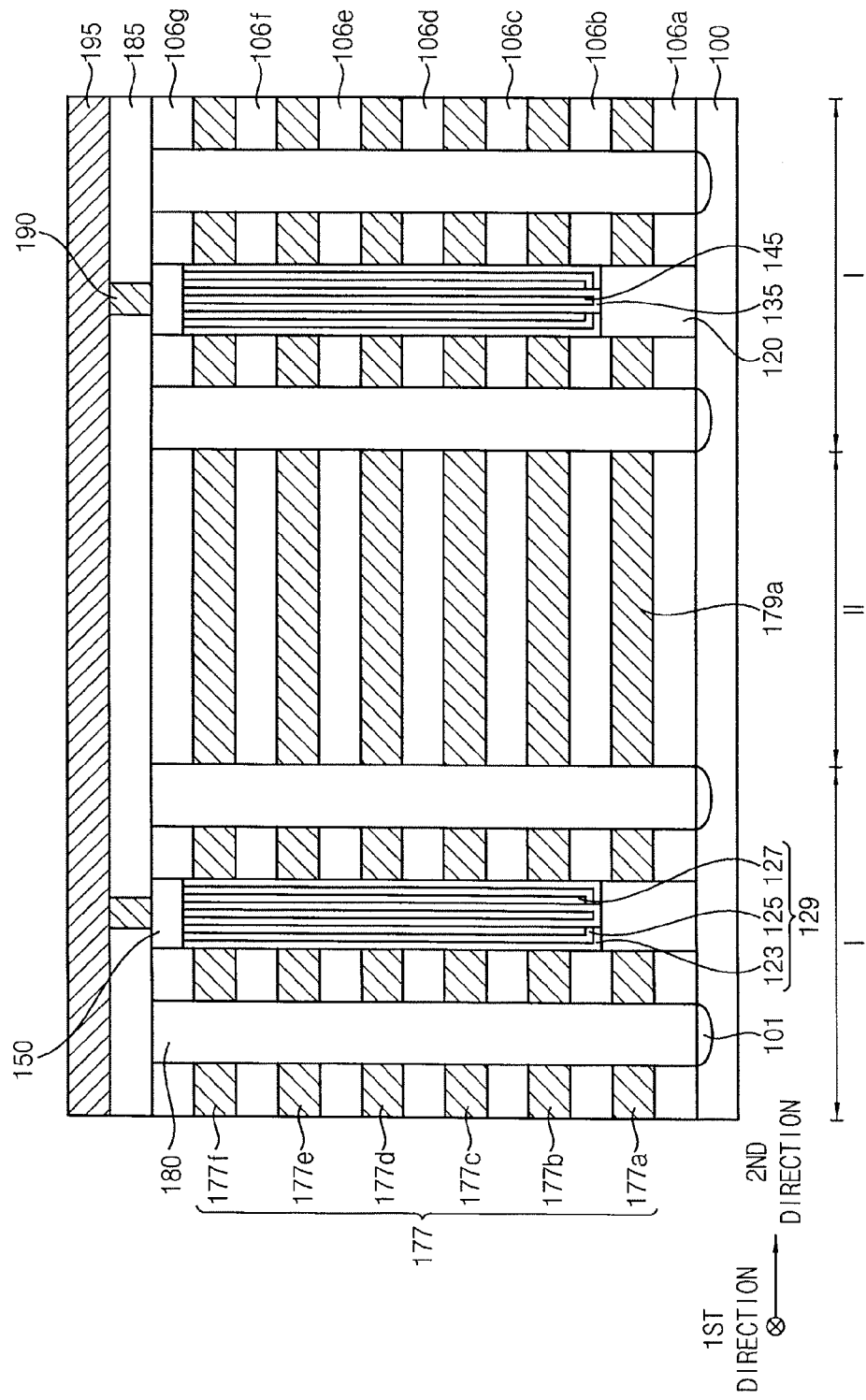

Referring to FIG. 30, processes substantially the same as or similar to those described previously with reference to FIGS. 16 and 17A may be performed. Accordingly, the impurity region 101 may be formed at the upper portion of the substrate 100 exposed by the opening 155 to serve as a CSL. The second filling layer pattern 180 filling the opening 155 may be formed on the impurity region 101. The upper insulation layer 185 may be formed on the insulating interlayer pattern 106, the pad 150, and the second filling layer pattern 180. The bit line contact 190 may be formed through the upper insulation layer 185 to contact the pad 150. The bit line 195 may be formed on the upper insulation layer 185 to be electrically connected to the pad 150 via the bit line contact 190.

By way of summary and review, according to example embodiments, embodiments provide a vertical memory device having a compact size and an excellent reliability, as well as a method of manufacturing the same. In particular, polysilicon or amorphous silicon may be used as a material for sacrificial layers, e.g., instead of a nitride-based material. Polysilicon or amorphous silicon have higher etching selectivity with respect to insulating interlayers containing an oxide-based material, e.g., than that of the nitride-based material. Thus, the sacrificial layers may be selectively removed without causing etching damage to the insulating interlayers, e.g., without removing portions of the insulating interlayers during removal of the sacrificial layers. Additionally, a thermal stress caused by multi-stacking, e.g., of nitride layers, may be suppressed so that a deformation of the mold structure and a misalignment of contacts and/or wirings may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a vertical memory device, the method comprising:
    forming alternating and repeating insulating interlayers and sacrificial layers on a substrate, the sacrificial layers including polysilicon or amorphous silicon;
    forming channel holes through the insulating interlayers and the sacrificial layers;
    forming channels in the channel holes;
    etching portions of the insulating interlayers and the sacrificial layers between adjacent channels to form openings;
    removing the sacrificial layers to form gaps between the insulating interlayers; and
    forming gate lines in the gaps.

2. The method as claimed in claim 1, wherein the channels and gate lines are formed on a cell region of the substrate, a dummy region of the substrate being defined between two adjacent cell regions.

3. The method as claimed in claim 2, wherein removing the sacrificial layers includes leaving portions of the sacrificial layers on the dummy region, such that the portions of the sacrificial layers on the dummy region define supporting patterns.

4. The method as claimed in claim 1, further comprising forming a dielectric layer structure between a sidewall of the channel hole and the channel, the gate lines surrounding an outer sidewall of the dielectric layer structure.

5. The method as claimed in claim 1, further comprising forming a semiconductor pattern on a top surface of the substrate exposed by the channel hole, before the forming the channel, the channel being formed on a top surface of the semiconductor pattern.

6. The method as claimed in claim 5, wherein forming the gate lines includes forming a ground selection line (GSL), at least one word line, and a string selection line (SSL) sequentially stacked from the top surface of the substrate, the GSL surrounding an outer sidewall of the semiconductor pattern.

7. The method as claimed in claim 6, further comprising removing a lateral portion of the semiconductor pattern together with the sacrificial layers to form a first recess, the GSL being inserted in the first recess.

8. The method as claimed in claim 1, further comprising providing impurities through the opening to form an impurity region at an upper portion of the substrate, the impurity region being a common source line (CSL).

9. The method as claimed in claim 8, further comprising partially removing the upper portion of the substrate together with the sacrificial layers to form a second recess, the impurities being implanted through the second recess.

10. The method as claimed in claim 1, further comprising forming barrier oxide layer patterns at lateral portions of the sacrificial layers exposed by the channel hole.

11. The method as claimed in claim 1, wherein:
    removing the sacrificial layers includes leaving portions of the sacrificial layers in the gaps to form preliminary gate lines; and
    forming the gate lines includes:
        forming a metal layer to fill remaining portions of the gaps, and
        reacting the metal layer and the preliminary gate lines to form a metal silicide pattern in each gap.

12. The method as claimed in claim 1, wherein:
    the insulating interlayer is formed using silicon oxide; and
    removing the sacrificial layers is performed by a gas phase etching process using a chlorine gas or a wet etching process using an etchant solution that contains a hydroxyl group.

13. The method as claimed in claim 1, wherein removing the sacrificial layers includes selectively removing only the sacrificial layers among the sacrificial layers and the insulating interlayers, such that substantially no portions of the insulating interlayers are removed.

14. A method of manufacturing a vertical memory device, the method comprising:
    stacking a plurality of alternating insulating interlayers and sacrificial layers on a substrate along a vertical direction with respect to a top surface of a substrate, the insulating interlayers including an oxide-based material, and the sacrificial layers including polysilicon or amorphous silicon;
    forming channels through the plurality of insulating interlayers and sacrificial layers, the channels extending along the vertical direction;

forming openings between adjacent channels, the openings extending along the vertical direction;

removing the sacrificial layers through the openings, such that gaps are defined between insulating interlayers adjacent to each other along the vertical direction; and forming gate lines in the gaps.

15. The method as claimed in claim 14, wherein removing the sacrificial layers includes removing only the sacrificial layers among the sacrificial layers and the insulating interlayers, such that substantially no portions of the insulating interlayers are removed.

16. The method as claimed in claim 14, wherein removing the sacrificial layers includes leaving portions of the sacrificial layers in a dummy region.

17. The method as claimed in claim 14, wherein:

stacking the plurality of alternating insulating interlayers and sacrificial layers includes alternating silicon oxide insulating interlayers and polysilicon sacrificial layers; and removing the sacrificial layers includes etching using a chlorine gas or a solution containing a hydroxyl group.

\* \* \* \* \*